United States Patent
McCaughan et al.

(10) Patent No.: US 10,236,433 B1
(45) Date of Patent: Mar. 19, 2019

(54) THERMAL IMPEDANCE AMPLIFIER

(71) Applicant: The United States of America, as Represented by the Secretary of Commerce, Washington, DC (US)

(72) Inventors: Adam McCaughan, Denver, CO (US); Varun Verma, Lafayette, CO (US); Sonia Buckley, Boulder, CO (US); Sae Woo Nam, Boulder, CO (US)

(73) Assignee: THE UNITED STATES OF AMERICA, AS REPRESENTED BY THE SECRETARY OF COMMERCE, Washington, DC (US)

( * ) Notice: Subject to any disclaimer, the term of this patent is extended or adjusted under 35 U.S.C. 154(b) by 0 days.

(21) Appl. No.: 15/878,010

(22) Filed: Jan. 23, 2018

(51) Int. Cl.
*H01L 39/16* (2006.01)
*H01L 39/10* (2006.01)
*H01L 39/02* (2006.01)
*H01L 39/24* (2006.01)
*H01L 29/43* (2006.01)
*H01L 39/14* (2006.01)
*H01L 39/04* (2006.01)

(52) U.S. Cl.
CPC .......... *H01L 39/10* (2013.01); *H01L 29/437* (2013.01); *H01L 39/025* (2013.01); *H01L 39/045* (2013.01); *H01L 39/145* (2013.01); *H01L 39/16* (2013.01); *H01L 39/2493* (2013.01)

(58) Field of Classification Search
None
See application file for complete search history.

(56) References Cited

U.S. PATENT DOCUMENTS

| | | | |
|---|---|---|---|
| 3,054,978 A | 9/1962 | Schmidlin et al. | |
| 4,334,158 A * | 6/1982 | Faris | H01L 39/228 257/36 |
| 4,869,598 A | 9/1989 | McDonald | |

(Continued)

FOREIGN PATENT DOCUMENTS

WO 2014197048 12/2014

OTHER PUBLICATIONS

McCaughan, A. N., et al., A Superconducting-Nanowire Three-Terminal Electrothermal Device, Nano Letters, 2014, 5748-5753, 14.

(Continued)

*Primary Examiner* — Minh-Loan Tran
(74) *Attorney, Agent, or Firm* — Office of Chief Counsel for National Institute of Standards and Technology

(57) ABSTRACT

A thermal impedance amplifier includes: a resistive layer including: a resistance member; a first electrode in electrical communication with the resistance member; and a second electrode in electrical communication with the resistance member; a switch layer opposing the resistive layer and including: a switch member; a first switch electrode in electrical communication with the switch member; and a second switch electrode in electrical communication with the switch member, the switch member: switching from a first resistance to a second resistance in response to receiving phonons from the resistance member, being superconductive at the first resistance, and producing an amplified voltage in response to being at the second resistance; and a thermal conductor interposed between the resistance member and the switch member.

11 Claims, 33 Drawing Sheets

(56) References Cited

U.S. PATENT DOCUMENTS

| | | |
|---|---|---|
| 4,904,970 A | 2/1990 | Srivastava |
| 5,306,927 A * | 4/1994 | Dalrymple ............ H01L 29/872 |
| | | 257/31 |
| 6,365,912 B1 | 4/2002 | Booth et al. |
| 9,509,315 B2 | 11/2016 | McCaughan et al. |

OTHER PUBLICATIONS

Lee, S-B., et al., Superconducting nanotransistor based digital logic gates, Nanotechnology, 2003, 188-191, 14.

Gallagher, W.J., Three-terminal superconducting devices, IEEE Transactions on magnetics, 1985, 709-716, 21 (2).

* cited by examiner

THERMAL IMPEDANCE AMPLIFIER

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 18-002US1.

BRIEF DESCRIPTION

Disclosed is a thermal impedance amplifier comprising: a resistive layer comprising: a resistance member; a first electrode in electrical communication with the resistance member; and a second electrode in electrical communication with the resistance member such that the resistance member is electrically interposed between the first electrode and the second electrode, the resistance member producing phonons in response to being subjected to an electric potential formed by a voltage difference between the first electrode and the second electrode; a switch layer opposing the resistive layer and comprising: a switch member; a first switch electrode in electrical communication with the switch member; and a second switch electrode in electrical communication with the switch member such that the switch member is electrically interposed between the first switch electrode and the second switch electrode, the switch member: switching from a first resistance to a second resistance in response to receiving phonons from the resistance member, being superconductive at the first resistance, and producing an amplified voltage in response to being at the second resistance; and a thermal conductor interposed between the resistance member and the switch member and that: electrically isolates the resistance member from the switch member; thermally conducts heat from the resistance member to the switch member; and conducts phonons from the resistance member to the switch member to heat the switch member.

Also disclosed is a process for producing an amplified voltage with a thermal impedance amplifier, the process comprising: producing a voltage difference between the first electrode and the second electrode; subjecting the resistance member to the electric potential formed by the voltage difference; producing, by the resistance member, phonons in response to being subjected to the electric potential; communicating the phonons from the resistance member to the switch member through the thermal conductor; receiving the phonons by the switch member; heating the switch member in response to receiving the phonons from the thermal conductor; switching, by the switch member, from the first resistance to the second resistance in response to the heating the switch member; and producing the amplified voltage in response to switching to the second resistance to produce the amplified voltage.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
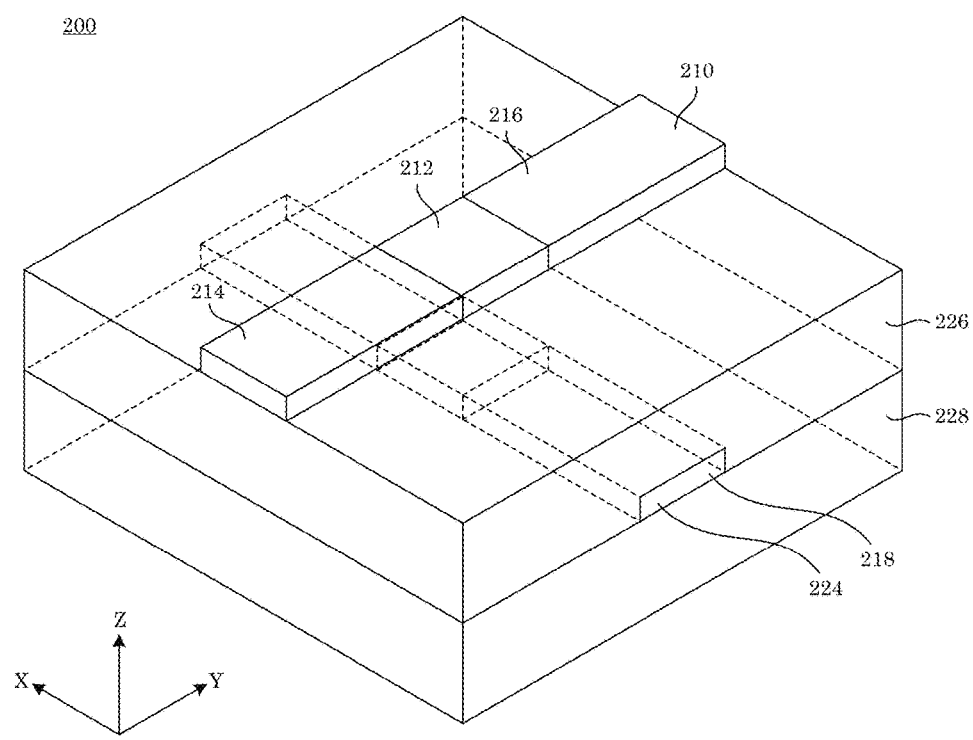
FIG. 1 shows a perspective view of a thermal impedance amplifier.
Figure 2:
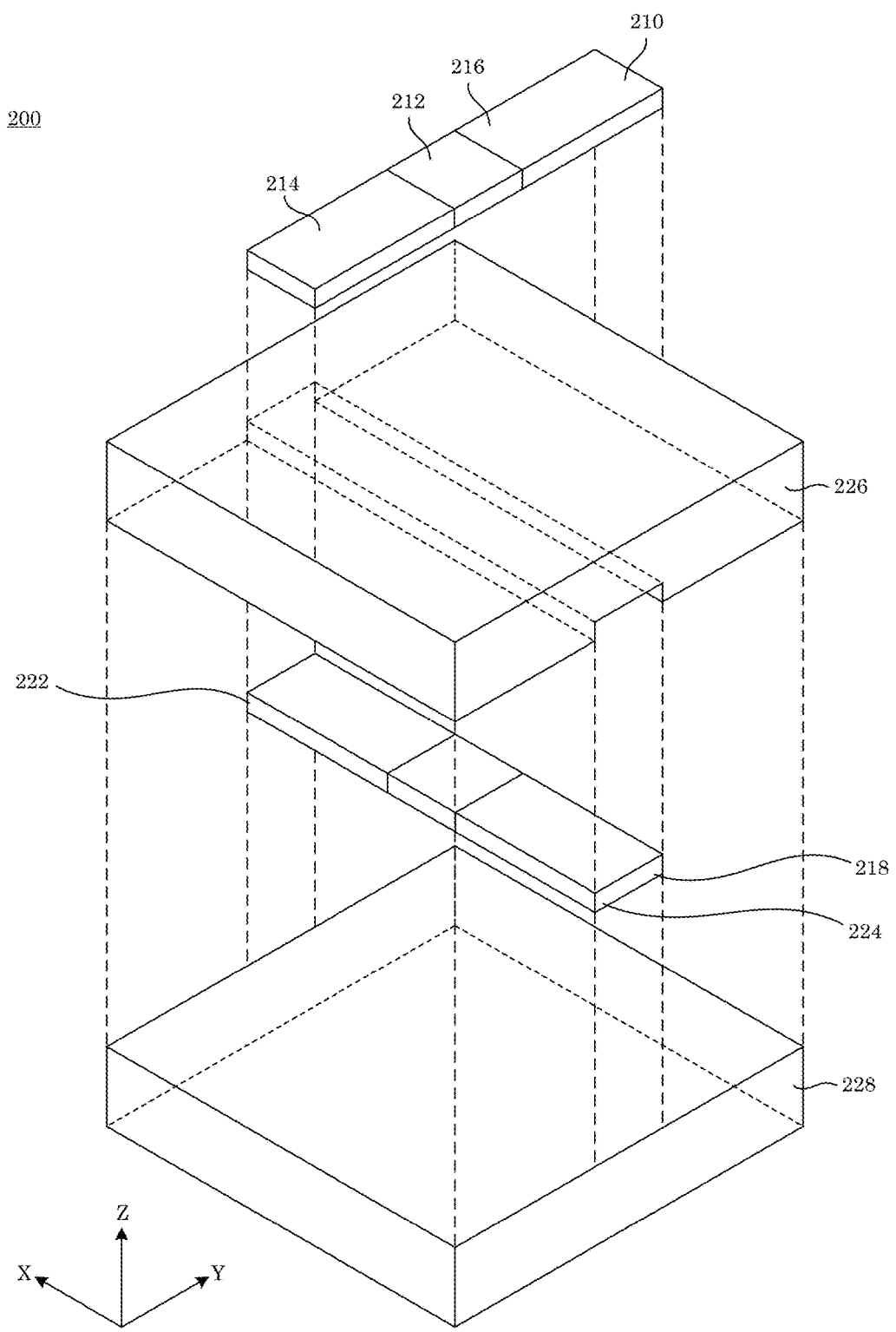
FIG. 2 shows an exploded view of the thermal impedance amplifier shown in FIG. 1.
Figure 3:
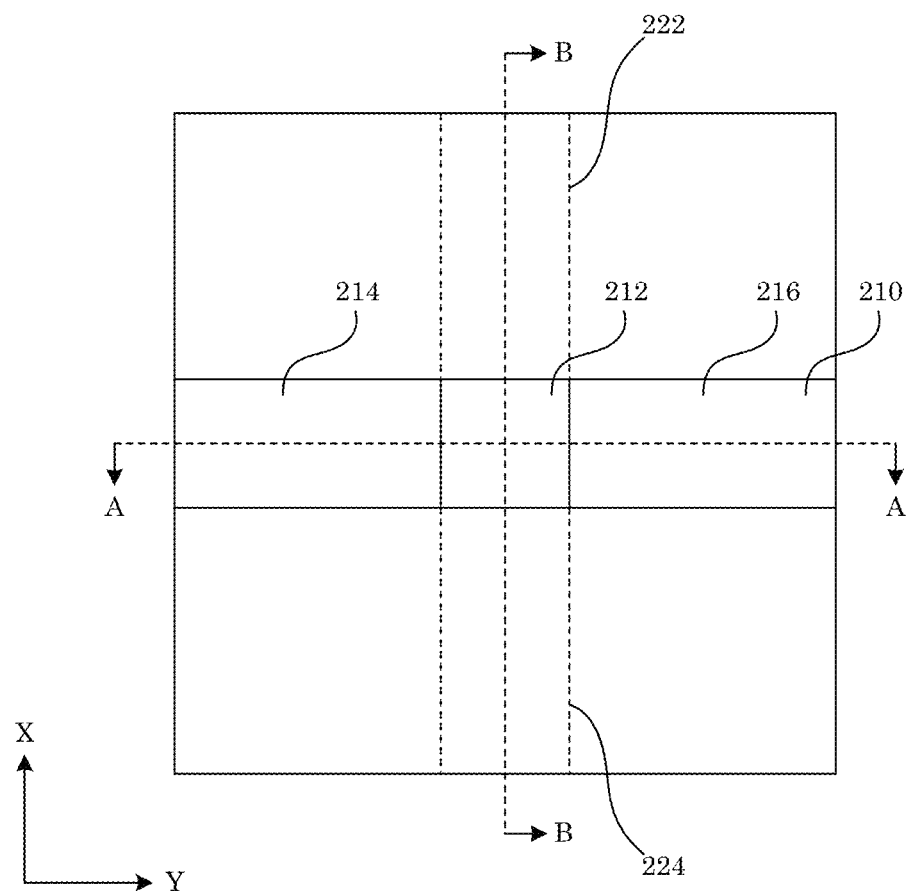
FIG. 3 shows a top view of the thermal impedance amplifier shown in FIG. 1.
Figure 4:
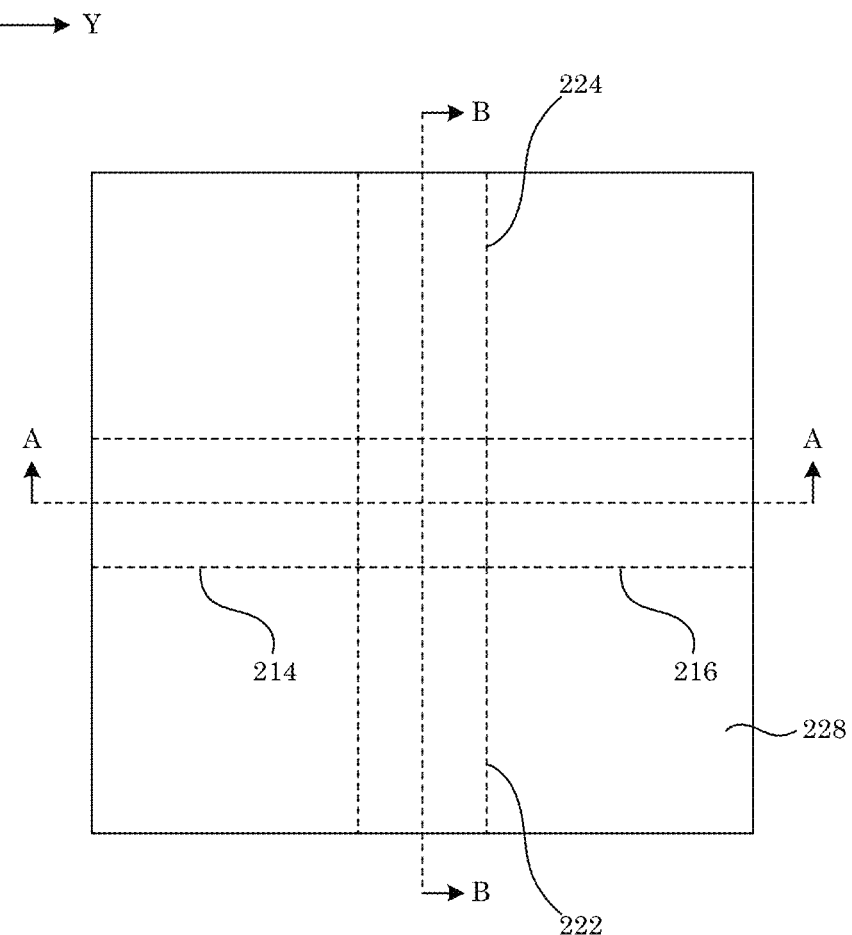
FIG. 4 shows a bottom view of the thermal impedance amplifier shown in FIG. 1.
Figure 5:
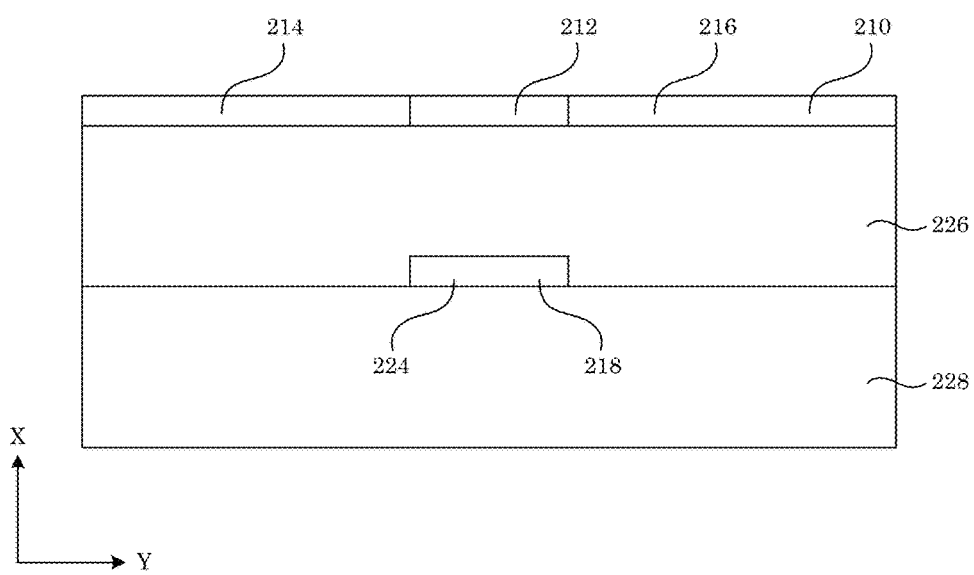
FIG. 5 shows a side view of the thermal impedance amplifier shown in FIG. 1.
Figure 6:
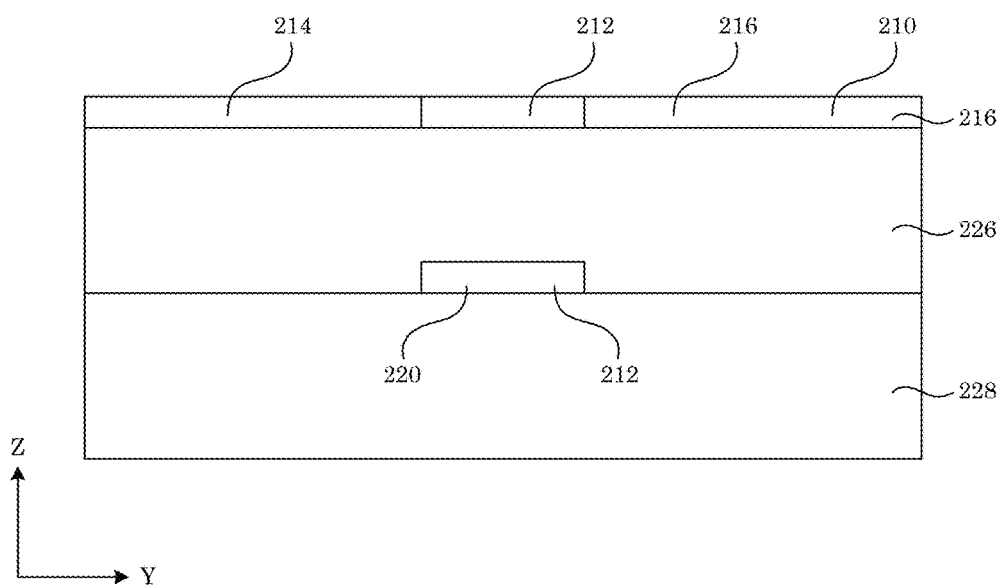
FIG. 6 shows an cross-section along line A-A of the thermal impedance amplifier shown in FIG. 3.
Figure 7:
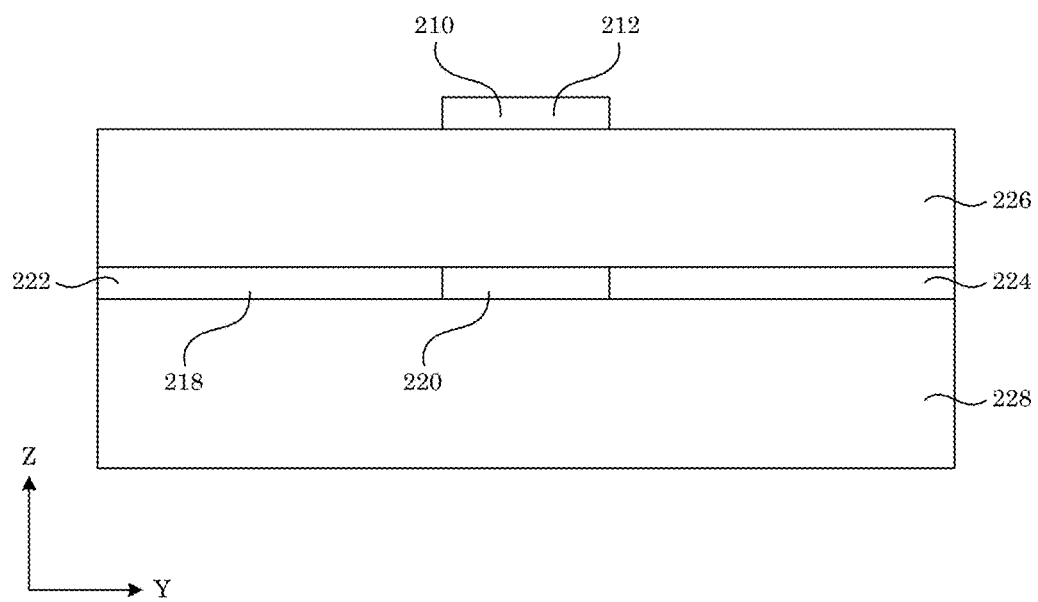
FIG. 7 shows an cross-section along line B-B of the thermal impedance amplifier shown in FIG. 3.
Figure 8:
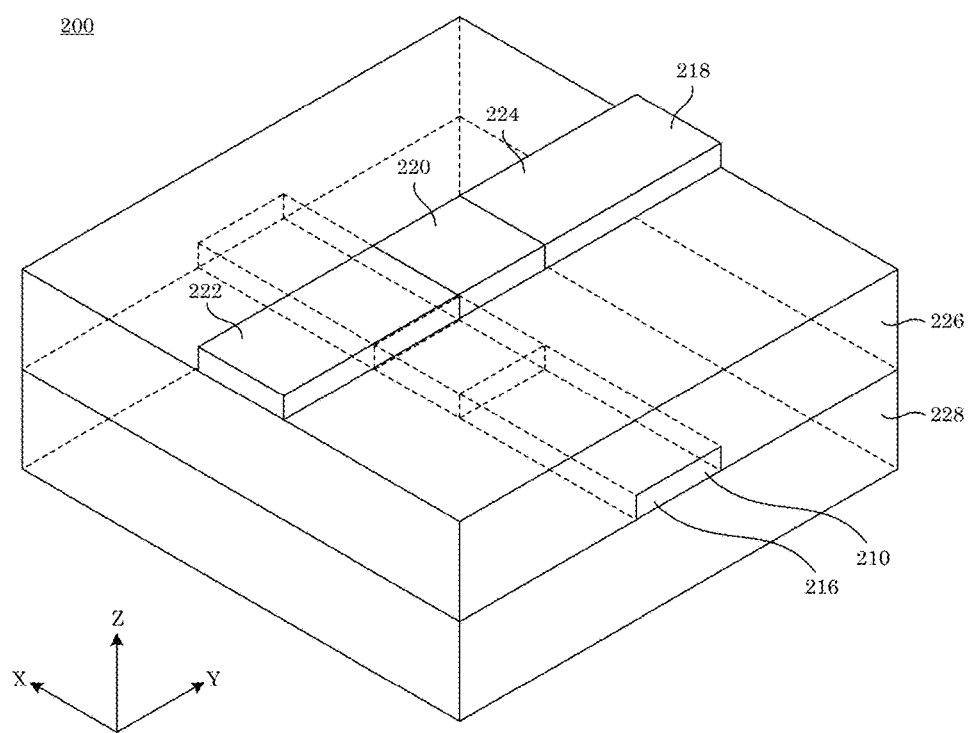
FIG. 8 shows a perspective view of a thermal impedance amplifier.
Figure 9:
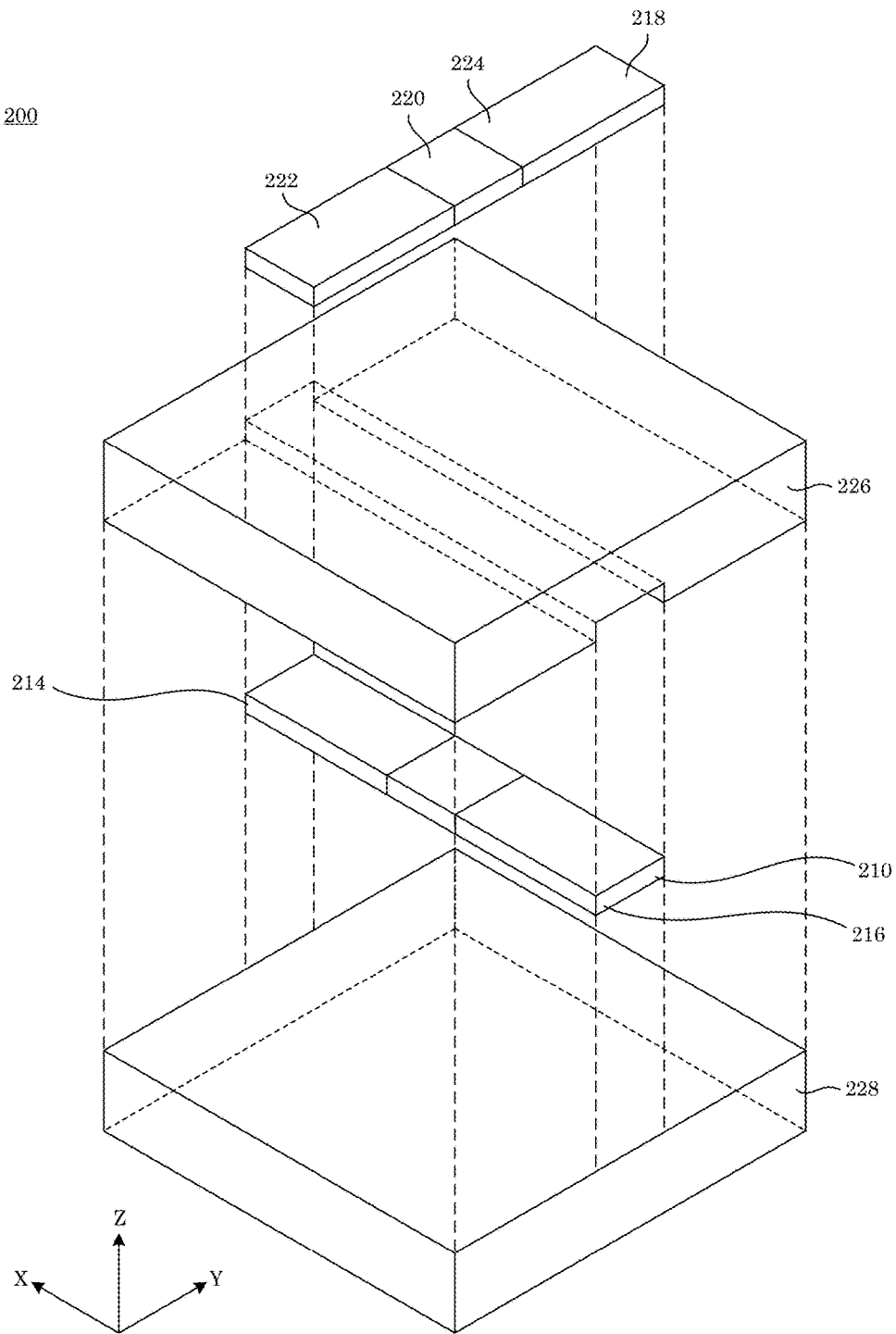
FIG. 9 shows an exploded view of the thermal impedance amplifier shown in FIG. 8.
Figure 10:
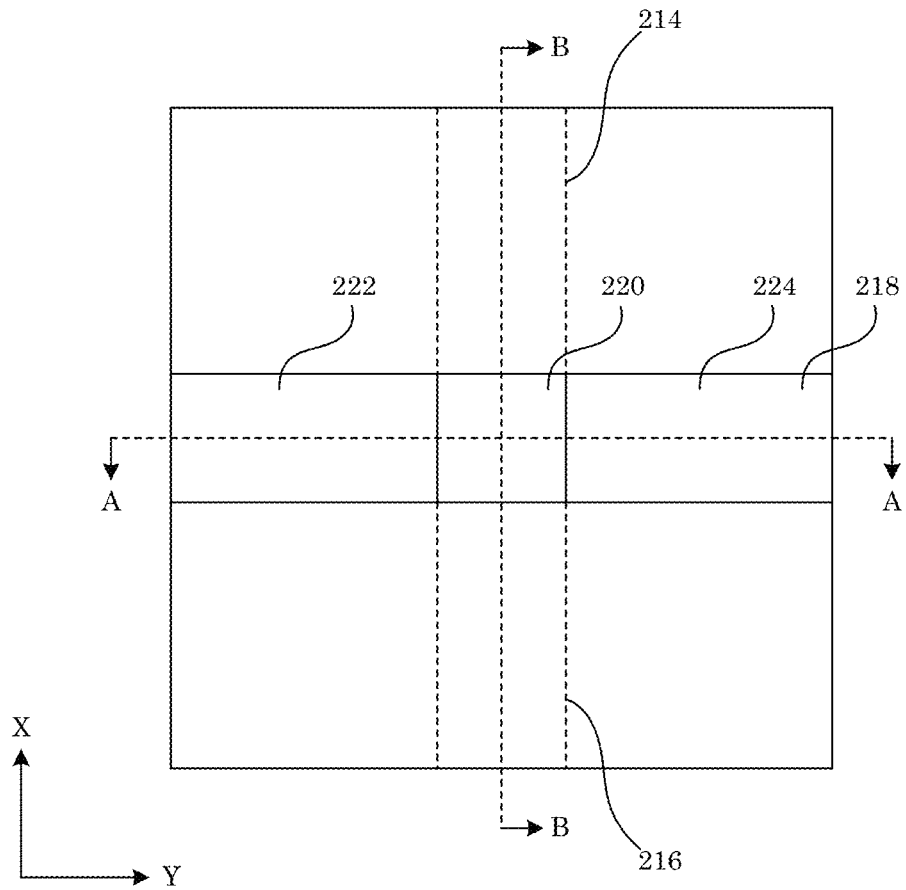
FIG. 10 shows a top view of the thermal impedance amplifier shown in FIG. 8.
Figure 11:
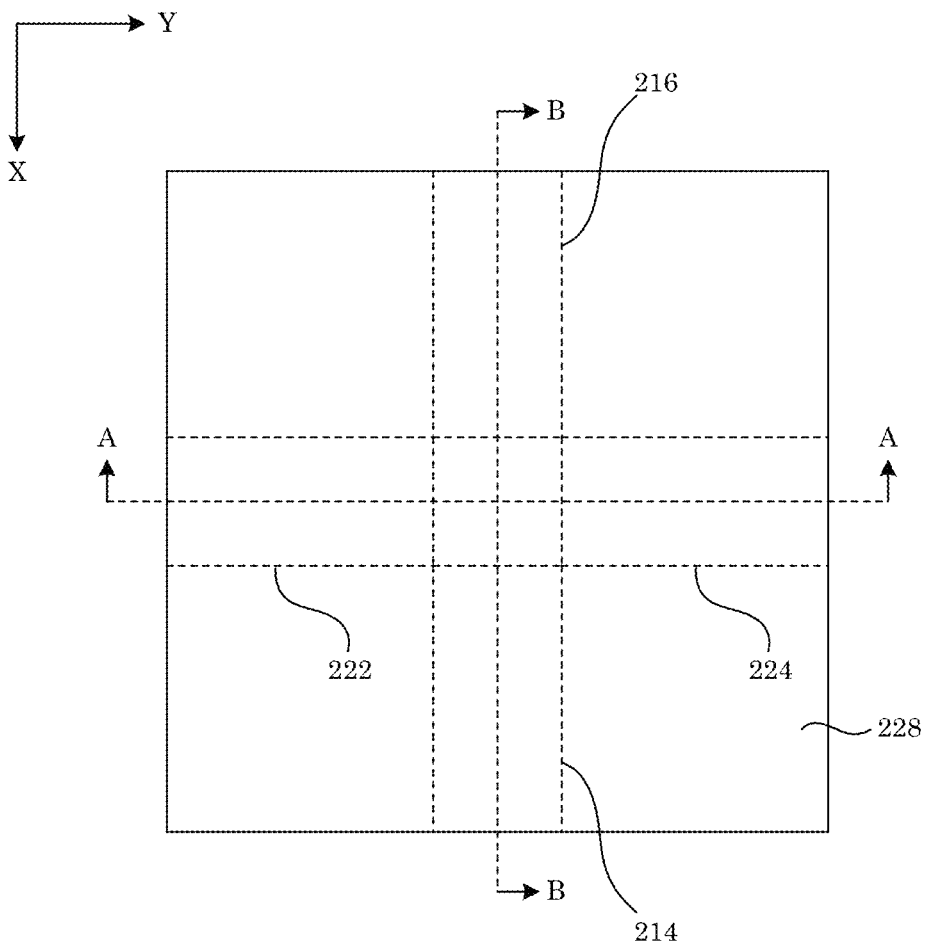
FIG. 11 shows a bottom view of the thermal impedance amplifier shown in FIG. 8.
Figure 12:
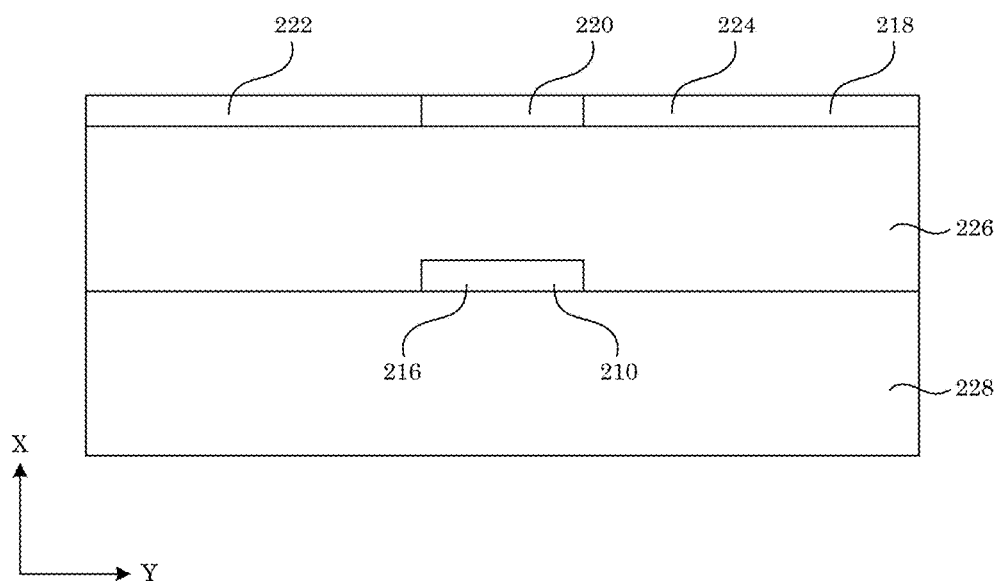
FIG. 12 shows a side view of the thermal impedance amplifier shown in FIG. 8.
Figure 13:
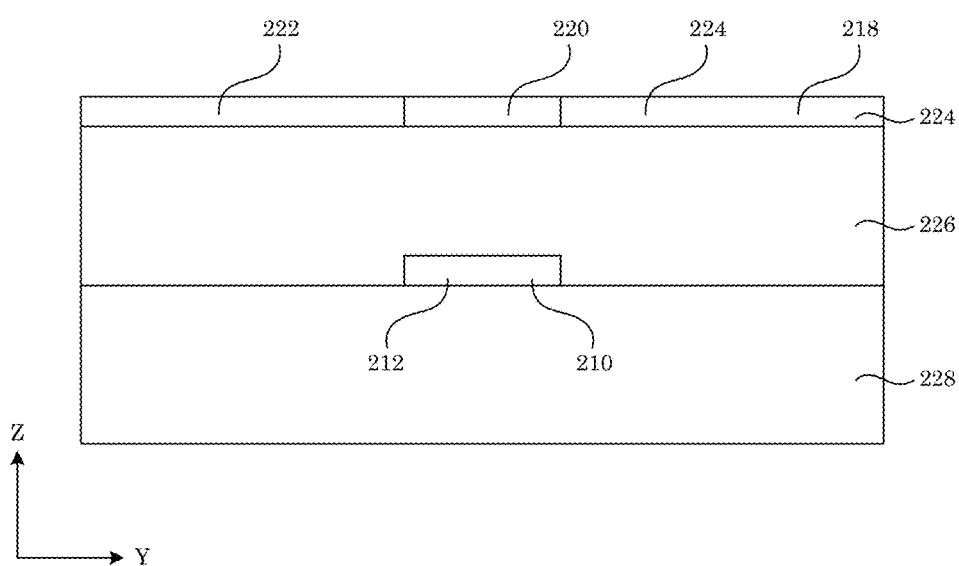
FIG. 13 shows an cross-section along line A-A of the thermal impedance amplifier shown in FIG. 10.
Figure 14:
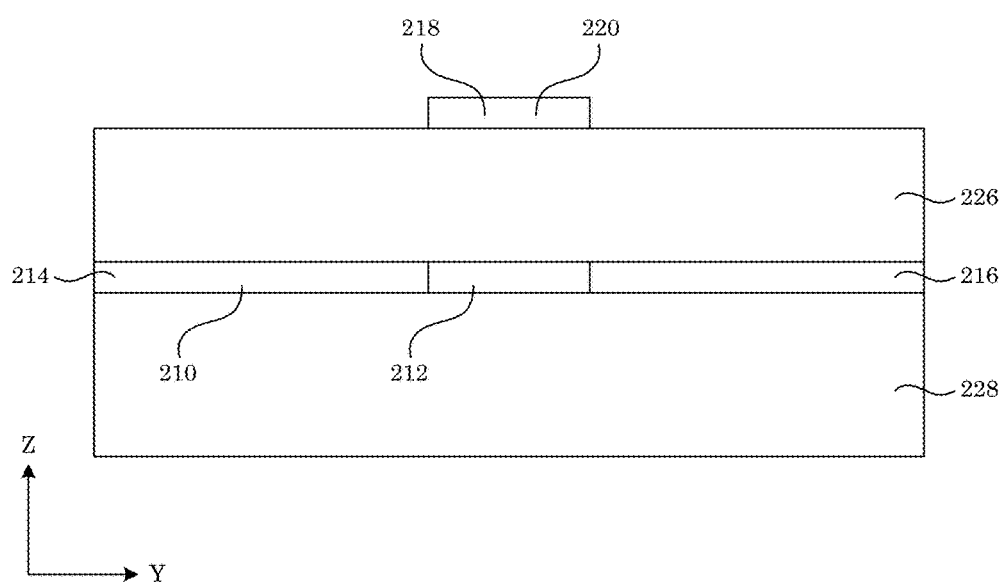
FIG. 14 shows an cross-section along line B-B of the thermal impedance amplifier shown in FIG. 10.
Figure 15:
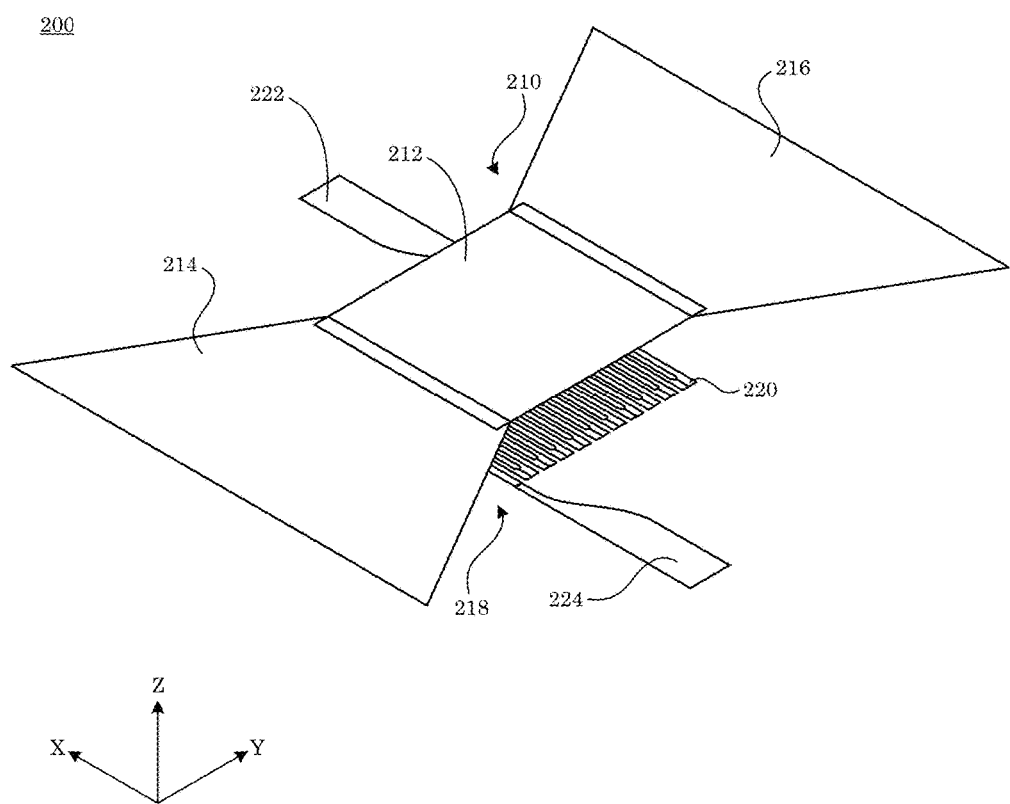
FIG. 15 shows a perspective view of a thermal impedance amplifier.
Figure 16:
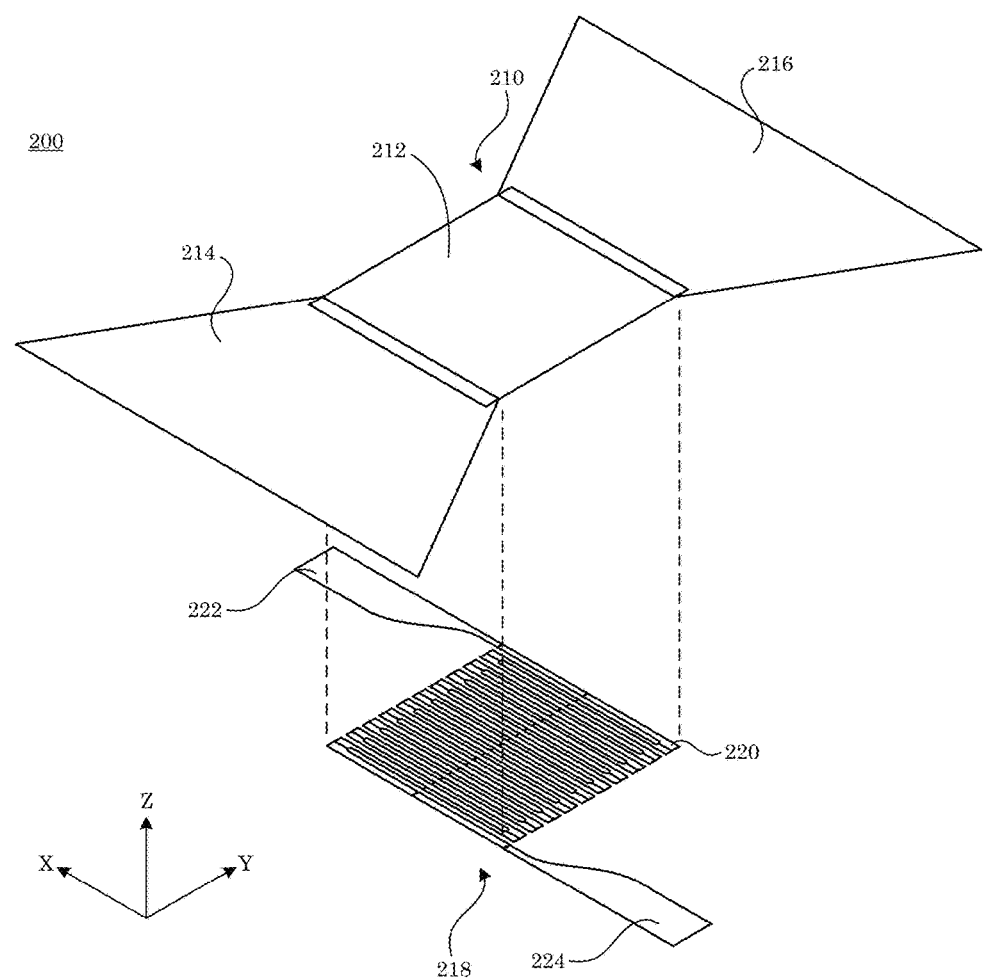
FIG. 16 shows an exploded view of the thermal impedance amplifier shown in FIG. 15.
Figure 17:
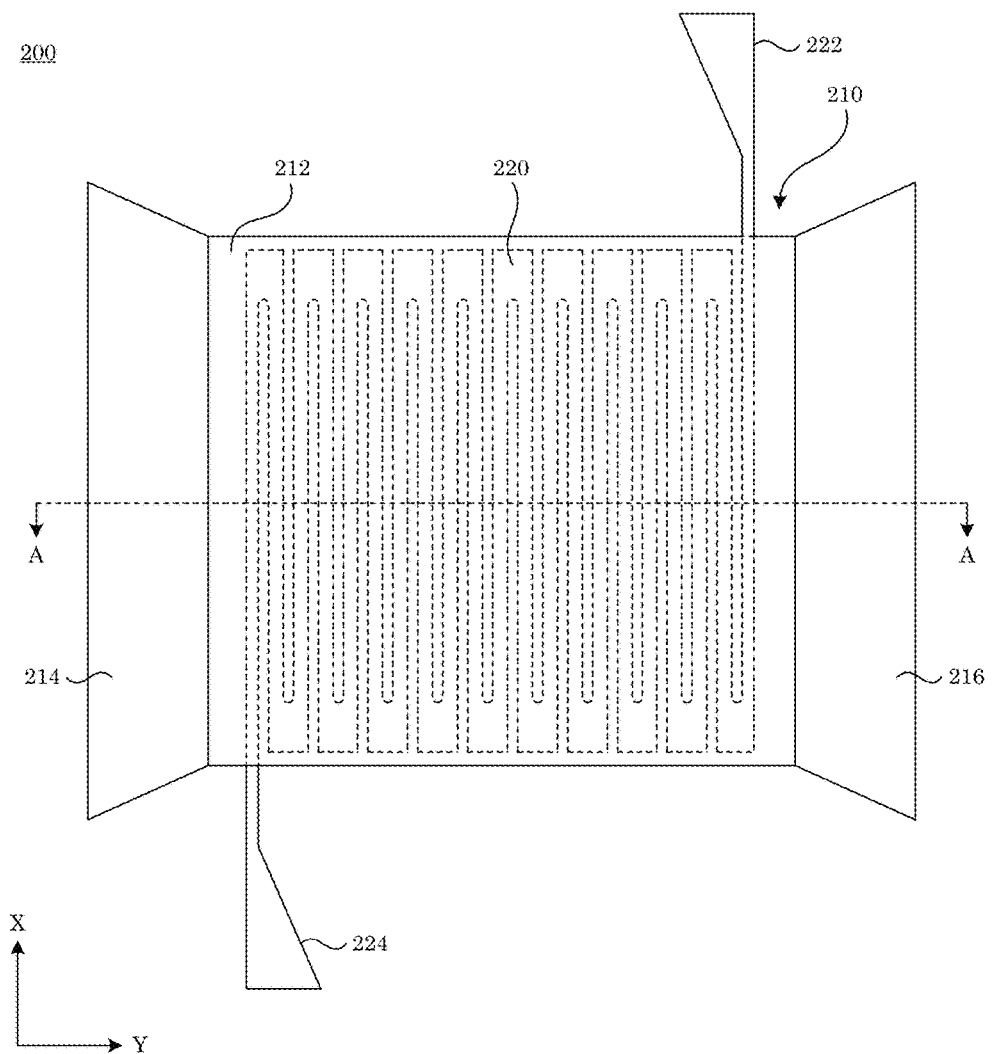
FIG. 17 shows a top view of the thermal impedance amplifier shown in FIG. 15.
Figure 18:
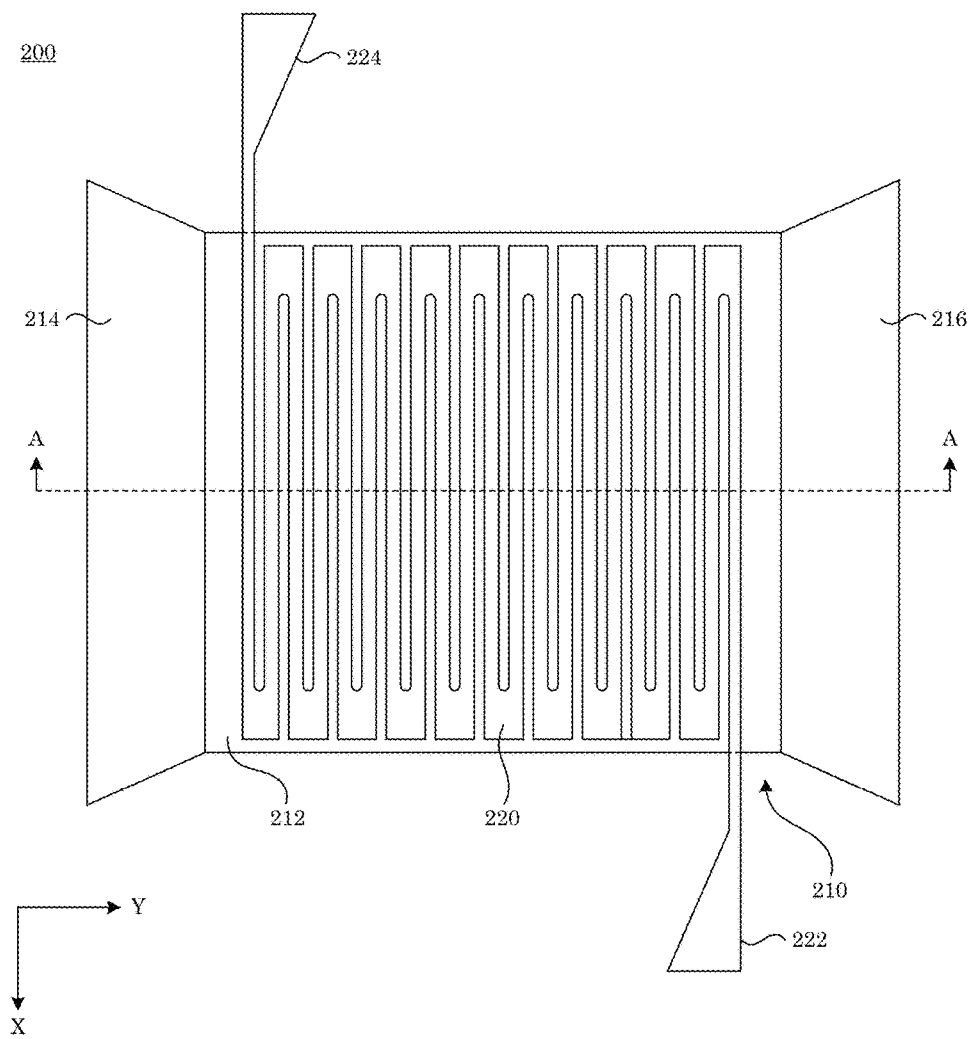
FIG. 18 shows a bottom view of the thermal impedance amplifier shown in FIG. 15.
Figure 19:
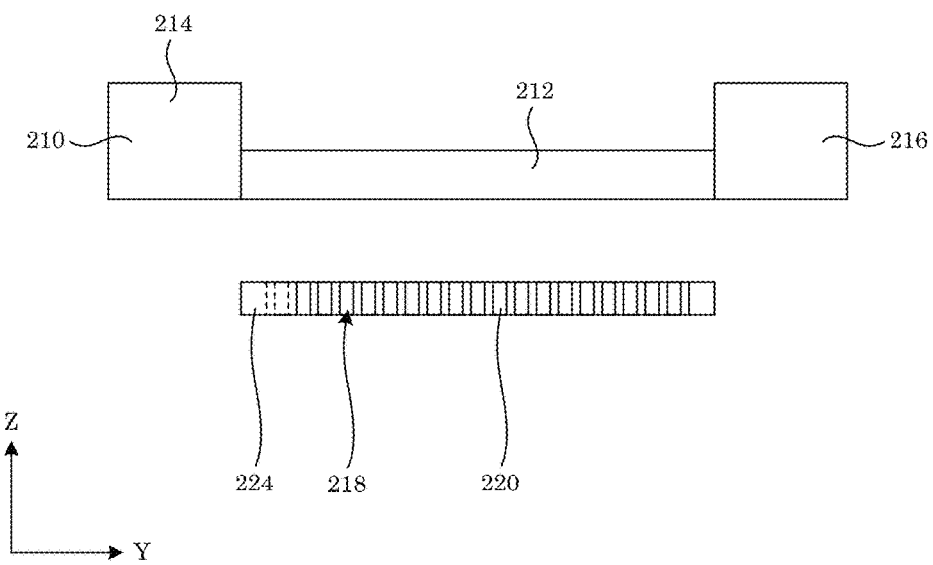
FIG. 19 shows a side view of the thermal impedance amplifier shown in FIG. 15.
Figure 20:
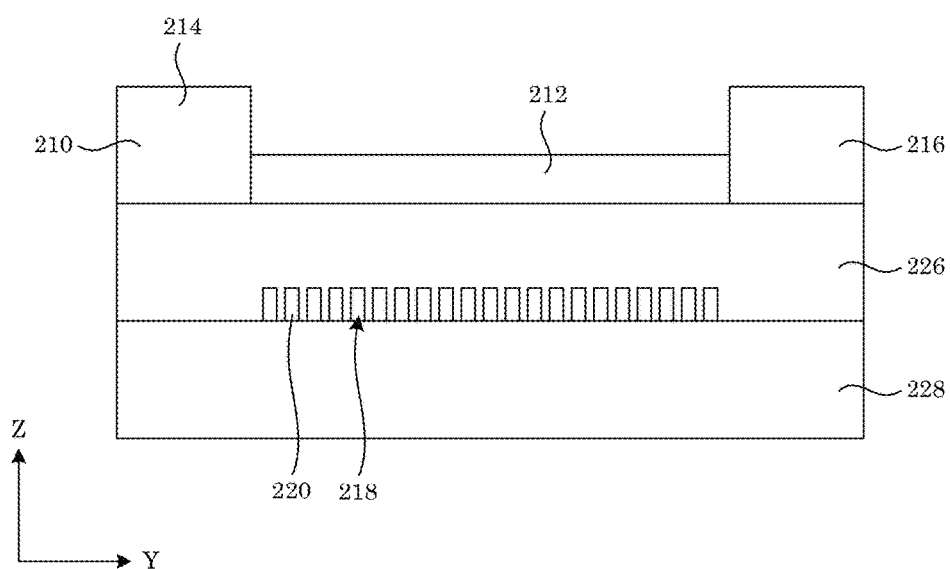
FIG. 20 shows an cross-section along line A-A of the thermal impedance amplifier shown in FIG. 17.
Figure 21:
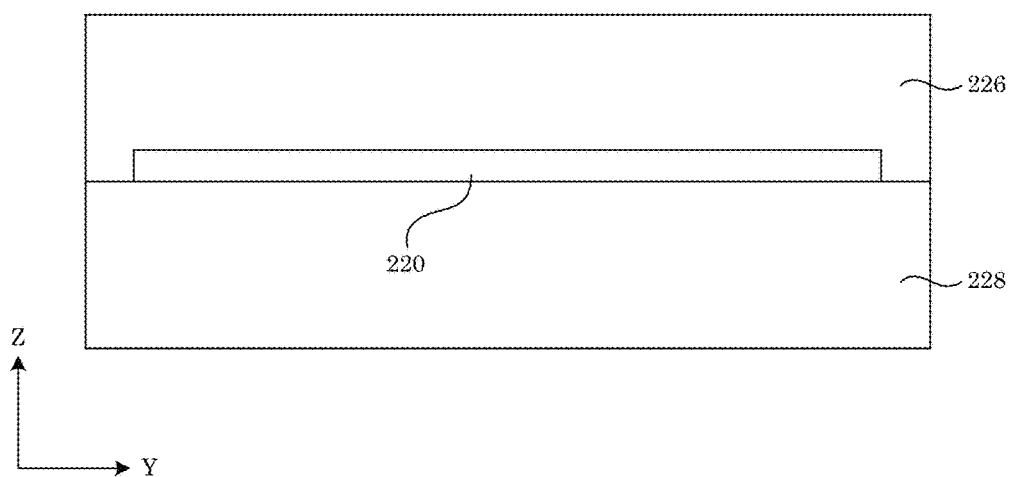
FIG. 21 shows an cross-section along line B-B of the thermal impedance amplifier shown in FIG. 17.

A detailed description of one or more embodiments is presented herein by way of exemplification and not limitation.

It has been discovered that a thermal impedance amplifier and process for producing an amplified voltage unexpectedly and advantageously provide a low-power, low-impedance superconducting driver with a low-impedance (e.g., less than 100Ω) input compatible with superconducting electronics. The thermal impedance amplifier produces a high-impedance output (e.g., greater than 1 MΩ) that can drive a photonic modulator, CMOS memory, light-emitting diode, and the like.

In an embodiment, with reference to FIG. 1, FIG. 2, FIG. 3, FIG. 4, FIG. 5, FIG. 6, FIG. 7, FIG. 15, FIG. 16, FIG. 17, FIG. 18, FIG. 19, FIG. 20, and FIG. 21, thermal impedance amplifier 200 includes resistive layer 210 that includes resistance member 212; first electrode 214 in electrical communication with resistance member 212; and second electrode 216 in electrical communication with resistance member 212 such that resistance member 212 is electrically interposed between first electrode 214 and second electrode 216. Here, resistance member produces phonons 254 in response to being subjected to an electric potential formed by a voltage difference between first electrode 214 and second electrode 216. Thermal impedance amplifier 200 also includes switch layer 218 opposing resistive layer 210 and including switch member 220; first switch electrode 222 in electrical communication with switch member 220; and second switch electrode 224 in electrical communication with switch member 220 such that switch member 220 is electrically interposed between first switch electrode 222 and second switch electrode 224. In this manner, switch member 220 switches from a first resistance to a second resistance in response to receiving phonons 254 from resistance member 212, is superconductive at the first resistance, and produces an amplified voltage in response to being at the second resistance. Additionally, thermal impedance amplifier 200 includes thermal conductor 226 interposed between resistance member 212 and switch member 220. It is contemplated that thermal conductor 226 electrically isolates resistance member 212 from switch member 220, thermally conducts heat from resistance member 212 to switch member 220, and conducts phonons from resistance member 212 to switch member 220 to heat switch member 220.

In an embodiment, with reference to FIG. 8, FIG. 9, FIG. 10, FIG. 11, FIG. 12, FIG. 13, and FIG. 14, switch member 220, first switch electrode 222, and second switch electrode 224 can be disposed on resistance member 212, first electrode 214, and second electrode 216 such that resistance member 212 is disposed on substrate 228 and interposed between substrate 228 and switch member 220.

In an embodiment, thermal impedance amplifier 200 includes power source 250 in electrical communication with resistive layer 210. Power source 250 produces the voltage difference between first electrode 214 and second electrode 216.

According to an embodiment, thermal impedance amplifier 200 includes current source 252 in electrical communication with switch layer 218. Current source 252 communicates a bias current to switch member 220 such that the amplified voltage is produced by switch member 220 from the bias current when switch member 220 is at the second resistance.

In an embodiment, thermal impedance amplifier 200 includes substrate 228. Resistive layer 210, switch layer 218, and thermal conductor 226 are disposed on substrate 228.

Figure 22:
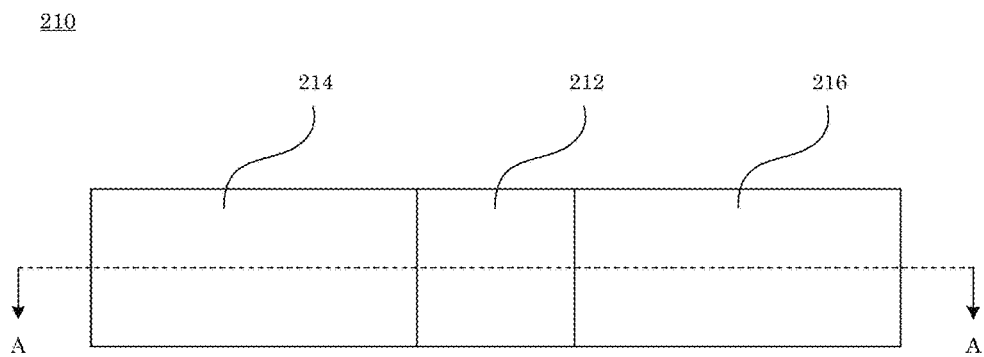
FIG. 22 shows a top view of a resistive layer.
Figure 23:
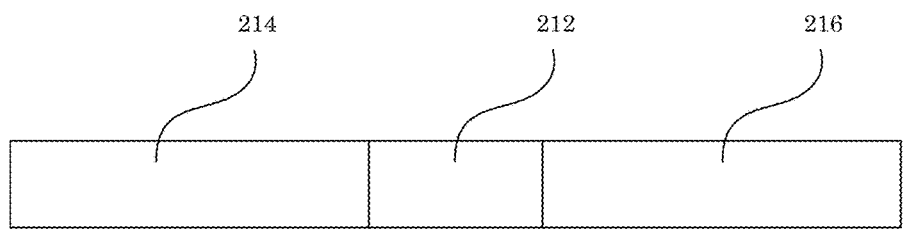
FIG. 23 shows a cross-section along line A-A of the resistive layer shown in FIG. 22.

It is contemplated that resistive layer 210 can include resistance member 212 along with electrodes such as first electrode 214 and second electrode 216. The electrodes can connect directly to the resistance member or can electrically couple to the resistance member 212 by capacitive or inductive couplers. The electrodes can deliver electrical voltage, current, or power to the resistance member 212. These elements can be formed from one or more layers of materials, for instance superconducting materials, resistive (Ohmic) materials, or semiconducting materials including but not limited to the resistor materials AuPd, Ti, W, Au, or zirconium-nitride, the superconducting materials WSi, NbN, MoSi, MoN, YBCO, Nb, or the semiconducting materials Si, p-Si, n-Si or Ge. The materials of resistive layer 210 can be selected based, e.g., on the impedance criteria such as their resistive, inductive or capacitive properties. The thickness may also be selected based on superconducting critical current, thickness constraints, or thermal conductance and can be from 1 nm to 500 nm, specifically from 2 nm to 30 nm, and more specifically from 4 nm to 15 nm. A width W of resistive layer 210 can be selected based, e.g., on input impedance requirements, total resistance, inductance, or capacitance values, or space constraints and can be from 10 nm to 1 mm, specifically from 50 nm to 500 μm, and more specifically from 100 nm to 100 μm. Moreover, the width or thickness of the first electrode 214 and second electrode 216 may be different from the width or thickness of the resistance member 212. In an embodiment, with reference to FIG. 22 and FIG. 23, resistive layer 210 is planar such that first electrode 214, resistance member 212, and second electrode 216 are coplanar. A shape of resistive layer 210 can be, e.g., a straight line, a tee-shape, a meander, one or two tapered electrodes which meet the resistance member, a cross, a meander, or a combination thereof.

In thermal impedance amplifier 200, resistance member 212 can include a resistor or heating element to produce phonons and raise the temperature in the immediate surrounding area and can be a resistive (Ohmic) material, a superconducting material, or semiconducting material including but not limited to the resistor materials AuPd, Ti, W, Au, or zirconium-nitride, the superconducting materials WSi, NbN, MoSi, MoN, YBCO, Nb, or the semiconducting materials Si, p-Si, n-Si or Ge. Moreover, the resistance member may be composed of several materials, for instance in a stack to prevent interlayer molecular diffusion between adjacent layers. A resistance of resistance member 212 can be selected based, e.g., on impedance matching requirements to the power supply 250, voltage range of power supply 250, or current range of power supply 250, and can be from 0.01Ω to 1,000Ω, specifically from 0.1Ω to 100Ω, and more specifically from 1Ω to 50Ω. A thickness of resistance member 212 can be selected based, e.g., on the total desired resistance, superconducting critical current, thermal specific heat, or thermal conductance, and can be from 1 nm to 500 nm, specifically from 2 nm to 30 nm, and more specifically from 4 nm to 15 nm. A width W of resistive member 212 can be selected based, e.g., on input impedance requirements, total resistance, inductance, or capacitance values, thermal specific heat, or space constraints and can be from 10 nm to 1 mm, specifically from 50 nm to 200 μm, and more specifically from 100 nm to 100 μm. Moreover, the width W of resistive member 212 may be chosen such that it nearly or exactly covers the bounding box area described by switch member 220, and it may be aligned with the switch member 220 in order to maximize phonon/heat transfer between the resistance member 212 and the switch member 220.

In thermal impedance amplifier 200, first electrode 214 can include electrical connections to connect to the resistance member 212 and provide power to it, and these elements can be a superconducting material, a resistive (Ohmic) material, or semiconducting material including but not limited to the resistor materials AuPd, Ti, W, Au, or zirconium-nitride, the superconducting materials WSi, NbN, MoSi, MoN, YBCO, Nb, or the semiconducting materials Si, p-Si, n-Si or Ge. A thickness of second electrode 216 can be selected based, e.g., on the total desired resistance, superconducting critical current, or thermal conductance and can be from 1 nm to 500 nm, specifically from 2 nm to 30 nm, and more specifically from 4 nm to 15 nm. A width W of first electrode 214 can be selected based, e.g., on input impedance requirements, total resistance, inductance, or capacitance values, or space constraints and can be from 10 nm to 1 mm, specifically from 50 nm to 500 µm, and more specifically from 100 nm to 100 µm. Moreover, the electrical connection made between the first electrode 214 and the resistance member 212 may include directly connected electrodes, capacitive couplers, or inductive couplers, and the first electrode 214 may be made from a material such as a superconductor which may thermally isolate the resistance member 212.

In thermal impedance amplifier 200, second electrode 216 can include electrical connections to connect to the resistance member 212 and provide power to it, and these elements can be a superconducting material, a resistive (Ohmic) material, or semiconducting material including but not limited to the resistor materials AuPd, Ti, W, Au, or zirconium-nitride, the superconducting materials WSi, NbN, MoSi, MoN, YBCO, Nb, or the semiconducting materials Si, p-Si, n-Si or Ge. A thickness of second electrode 216 can be selected based, e.g., on the total desired resistance, superconducting critical current, or thermal conductance and can be from 1 nm to 500 nm, specifically from 2 nm to 30 nm, and more specifically from 4 nm to 15 nm. A width W of first electrode 214 can be selected based, e.g., on input impedance requirements, total resistance, inductance, or capacitance values, or space constraints and can be from 10 nm to 1 mm, specifically from 50 nm to 500 µm, and more specifically from 100 nm to 100 µm. Moreover, the electrical connection made between the second electrode 216 and the resistance member 212 may include directly connected electrodes, capacitive couplers, or inductive couplers, and the second electrode 216 may be made from a material such as a superconductor which may thermally isolate the resistance member 212.

Figure 24:
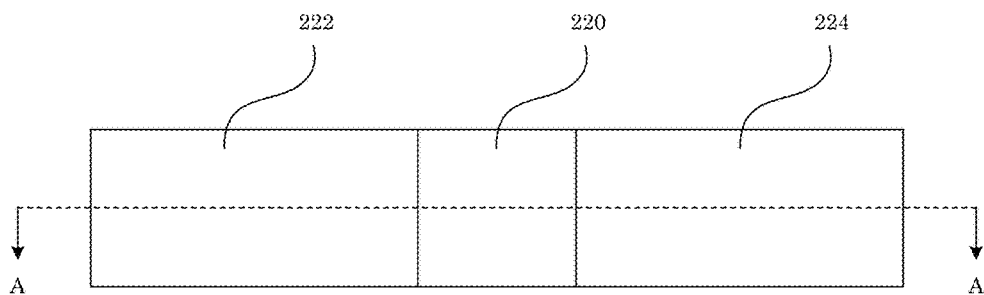
FIG. 24 shows a top view of a switch layer.
Figure 25:
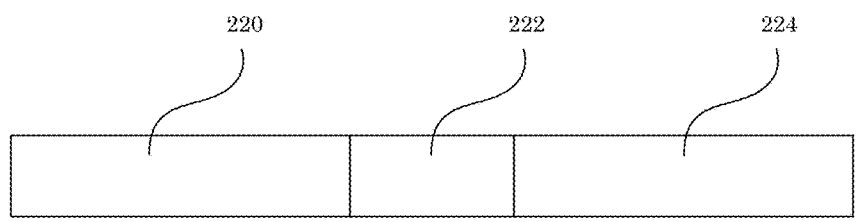
FIG. 25 shows a cross-section along line A-A of the switch layer shown in FIG. 24.
Figure 26:
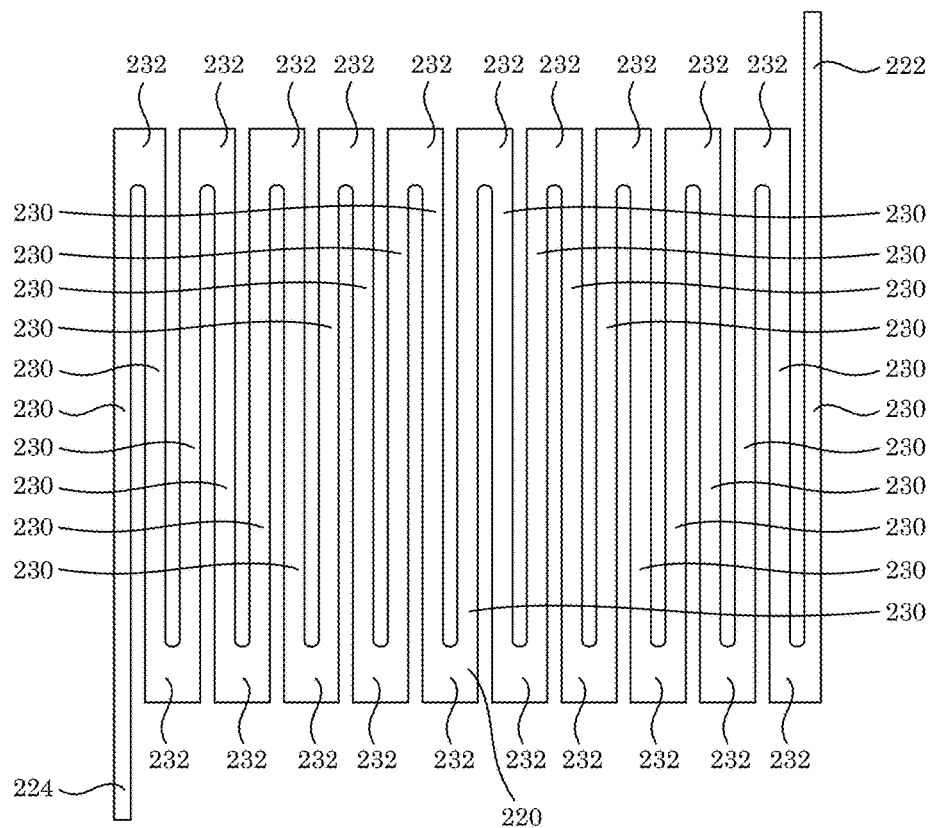
FIG. 26 shows a top view of a switch layer.
Figure 27:
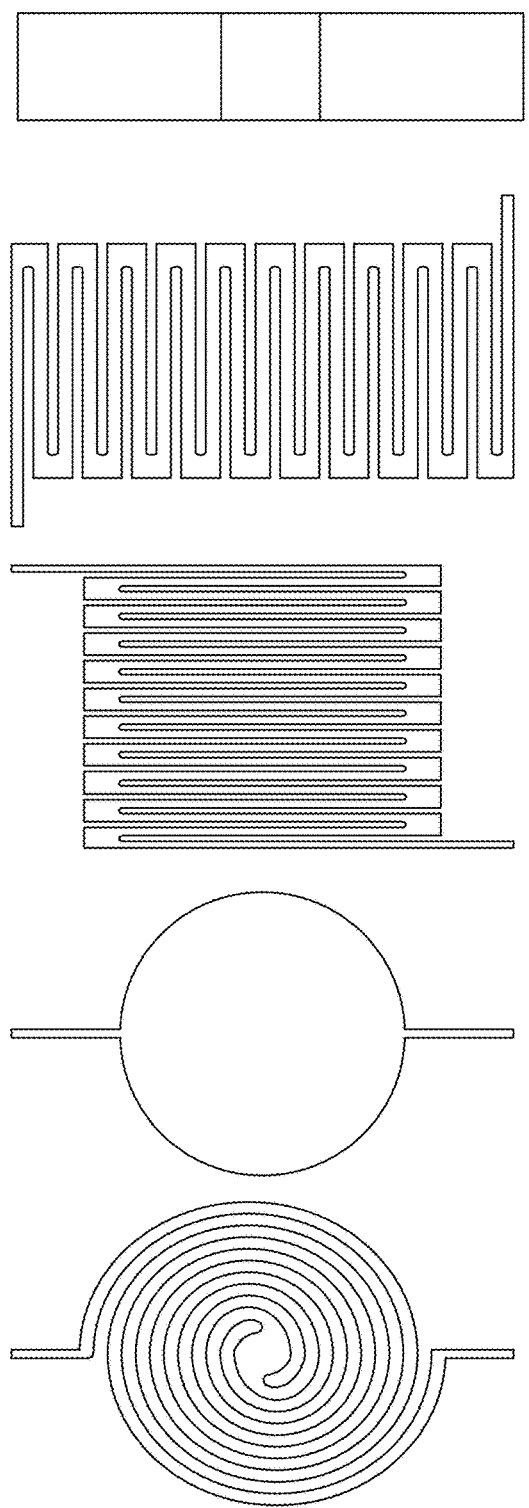
FIG. 27 shows a top view of a plurality of switch layers having different patterns of a switch member.

In thermal impedance amplifier 200, switch layer 218 can include a switch member 220 along with electrodes such as a first switch electrode 222 and second switch electrode 222. The electrodes may be connected directly to the switch member, or they may be electrically coupled to the switch member 212 by means of capacitive or inductive couplers. The electrodes may be used as a means of delivering electrical voltage, current, or power to the switch member 220. These elements may be formed from one or more layers of materials, for instance superconducting materials, resistive (Ohmic) materials, or semiconducting materials including but not limited to the resistor materials AuPd, Ti, W, Au, or zirconium-nitride, the superconducting materials WSi, NbN, MoSi, MoN, YBCO, Nb, or the semiconducting materials Si, p-Si, n-Si or Ge. The materials of switch layer 218 can be selected based, e.g., on the impedance criteria such as their resistive, inductive or capacitive properties. The thickness may also be selected based on superconducting critical current, thickness constraints, or thermal conductance and can be from 1 nm to 500 nm, specifically from 2 nm to 30 nm, and more specifically from 4 nm to 15 nm. A width W of switch layer 218 can be selected based, e.g., on input impedance requirements, total resistance, inductance, or capacitance values, or space constraints and can be from 10 nm to 1 mm, specifically from 50 nm to 500 µm, and more specifically from 100 nm to 100 µm. Moreover, the width or thickness of the first switch electrode 222 and second switch electrode 222 may be different from the width or thickness of the switch member 220. In an embodiment, with reference to FIG. 24 and FIG. 25, switch layer 218 is planar such that first switch electrode 222, switch member 220, and second switch electrode 222 are coplanar. A shape of switch layer 218 can be, e.g., a straight line, a tee-shape, a meander, one or two tapered electrodes which meet the switch member, a cross, a meander, or a combination thereof, such as shown in FIG. 26 and FIG. 27.

In thermal impedance amplifier 200, switch member 220 can include a superconducting wire element which is capable of changing its resistive value when its temperature is raised or phonons are received from e.g. the resistor member 212. Switch member 220 can be a superconducting material including but not limited to WSi, NbN, MoSi, MoN, YBCO, Nb. Moreover, the resistance member may be composed of multiple superconducting materials, for instance in a stack to prevent interlayer molecular diffusion between adjacent layers. A resistance of switch member 220 can be selected based, e.g., its normal-state resistance of switch, its superconducting retrapping (latching) current, or the current range of power supply 250, and can be from 100Ω to 10 MΩ, specifically from 500Ω to 1 MΩ, and more specifically from 1 kΩ to 1 MΩ. A thickness of switch member 220 can be selected based, e.g., on the total desired resistance when not superconducting, superconducting critical current, thermal specific heat, critical temperature, superconducting retrapping current, or thermal conductance, and can be from 1 nm to 500 nm, specifically from 2 nm to 30 nm, and more specifically from 4 nm to 15 nm. A width W of switch member 220 can be selected based, e.g., on input impedance requirements, total resistance, inductance, or capacitance values, thermal specific heat, or space constraints and can be from 10 nm to 1 mm, specifically from 50 nm to 200 µm, and more specifically from 100 nm to 100 µm. Moreover, the width W of resistive member 212 may be chosen such that it nearly or exactly covers the bounding box area described by resistance member 212, and it may be aligned with the resistance member 212 in order to maximize phonon/heat transfer between the resistance member 212 and the switch member 220. Additionally, the properties of the switch member 220 may be chosen such that the thermal impedance amplifier 200 input-output behavior is non-hysteretic and does not latch.

In thermal impedance amplifier 200, first switch electrode 222 can include electrical connections to connect to the resistance member 212 and provide power to it, and these elements can be a superconducting material, a resistive (Ohmic) material, or semiconducting material including but not limited to the resistor materials AuPd, Ti, W, Au, or zirconium-nitride, the superconducting materials WSi, NbN, MoSi, MoN, YBCO, Nb, or the semiconducting materials Si, p-Si, n-Si or Ge. A thickness of second switch electrode 224 can be selected based, e.g., on the total desired resistance, superconducting critical current, or thermal conductance and can be from 1 nm to 500 nm, specifically from 2 nm to 30 nm, and more specifically from 4 nm to 15 nm. A width W of first switch electrode 222 can be selected based, e.g., on input impedance requirements, total resistance, inductance, or capacitance values, or space constraints and can be from 10 nm to 1 mm, specifically from 50 nm to 500 µm, and more specifically from 100 nm to 100 µm. Moreover, the electrical connection made between the first switch electrode 222 and the resistance member 212 may include directly connected electrodes, capacitive couplers, or inductive couplers, and the first switch electrode 222 may be made from a material such as a superconductor which may thermally isolate the switch member 220.

In thermal impedance amplifier 200, second switch electrode 224 can include electrical connections to connect to the switch member 220 and provide power to it, and these elements can be a superconducting material, a resistive (Ohmic) material, or semiconducting material including but not limited to the resistor materials AuPd, Ti, W, Au, or zirconium-nitride, the superconducting materials WSi, NbN, MoSi, MoN, YBCO, Nb, or the semiconducting materials Si, p-Si, n-Si or Ge. A thickness of second switch electrode 224 can be selected based, e.g., on the total desired resistance, superconducting critical current, or thermal conductance and can be from 1 nm to 500 nm, specifically from 2 nm to 30 nm, and more specifically from 4 nm to 15 nm. A width W of first switch electrode 222 can be selected based, e.g., on input impedance requirements, total resistance, inductance, or capacitance values, or space constraints and can be from 10 nm to 1 mm, specifically from 50 nm to 500 μm, and more specifically from 100 nm to 100 μm. Moreover, the electrical connection made between the second switch electrode 224 and the switch member 220 may include directly connected electrodes, capacitive couplers, or inductive couplers, and the second switch electrode 224 may be made from a material such as a superconductor which may thermally isolate the switch member 220.

It is contemplated that thermal conductor 226 can include materials with electrically isolating properties to electrically separate the switch member 220 and resistance member 212, and also to thermally couple switch member 220 and resistance member 212. This material may a dielectric or partially-conducting material which conducts heat and phonons but restricts the flow of electrical current. The thermal conductor 226 may be formed from one or more layers of materials, for instance dielectric materials, or semiconducting materials, including but not limited to the dielectric materials NbOx, AlOx, SiO2, SiN, HfSiO4, HfO2, ZrO2 or the semiconducting materials Si, p-Si, n-Si, amorphous Si, or Ge. The materials of thermal conductor 226 can be selected based, e.g., on the impedance criteria such as their resistive or capacitive properties, their qualities as a diffusion barrier, their permittivity, their specific heat or thermal conduction properties, or their crystallinity or lack thereof. The thickness may also be selected based on characteristic phonon length scale, thickness constraints, or thermal conductance and can be from 1 nm to 200 nm, specifically from 2 nm to 50 nm, and more specifically from 4 nm to 30 nm. Moreover, the thermal conductor may nanopatterned to engineer the thermal conductivity, and may be present between the entire resistive layer 210 and switch layer 218 or present only in the vicinity of the resistance member 212 and switch member 220. electrically from the width or thickness of the resistance member 212. In an embodiment, the thermal conductor 226 is planar and made of a uniform material.

It is contemplated that substrate 228 can include a layer to support the switch layer 218, thermal conductor 226, and resistive layer 210, and to draw heat and phonons away from the other elements. This material may a dielectric or partially-conducting material which conducts heat and phonons but restricts the flow of electrical current. The substrate 228 may be formed from one or more layers of materials, for instance dielectric materials, or semiconducting materials, including but not limited to the dielectric materials NbOx, AlOx, SiO2, SiN, HfSiO4, HfO2, ZrO2 or the semiconducting materials Si, p-Si, n-Si, amorphous Si, or Ge. The materials of substrate 228 can be selected based, e.g., on the impedance criteria such as their resistive or capacitive properties, their qualities as a diffusion barrier, their permittivity, their thermal conduction properties, or their crystallinity or lack thereof. The thickness may also be selected based on characteristic phonon length scale, thickness constraints, or thermal conductance and can be from 1 nm to 200 nm, specifically from 2 nm to 50 nm, and more specifically from 4 nm to 30 nm. Moreover, the substrate 228 may nanopatterned to engineer the thermal conductivity, or may be undercut in order to make it form a membrane that reduce substrate 228 being drawn under heating. In an embodiment, substrate 228 is planar and made of a uniform material.

It is contemplated that power source 250 can include voltage sources or current sources, to switch on and switch off electrical power to resistance member 220, and can be operated either as a constant input (DC) or a time-varying input. A voltage of power source 216 can be selected based, e.g., the resistance of resistance member 212 or heat requirements of switch member 220, and can be from −5 V to +5 V, specifically from −100 mV to +100 mV, and more specifically from −10 mV to +10 mV. A current of power source 216 can be selected based, e.g., the resistance of resistance member 212 or heat requirements of switch member 220, and can be from −100 mA to 100 mA, specifically from −10 mA to +10 mA, and more specifically from −1 mA to +1 mA. Moreover, power source 250 may include impedance matching elements, such as inductors or capacitors.

It is contemplated that current source 252 can be used to provide an electrical current bias to the switch member 220 and will be capable of producing the amplified output voltage across switch member 220. A current of power source 252 can be selected based, e.g., the normal-state resistance of switch member 220, the superconducting retrapping (latching) current of switch member 220, power limitations of thermal impedance amplifier 200, and can be from −1 mA to 1 mA, specifically from −100 μA to +100 μA, and more specifically from −20 μA to +20 μA. Moreover, current source 252 can include an inductive current loop, a semiconductor current source, or a resistor biased with a voltage.

It is contemplated that phonons 254 can be generated by the resistance member 212, can be carried through the thermal conductor 226, and can break down the superconducting state in switch member 220. The phonons may break the superconducting state in switch member 220 by breaking apart Cooper pairs until the normal state resistance is achieved, or by raising the temperature of the switch member. The phonons 254 may also be carried away by the thermal conductor 226 or the substrate 228 in order to restore the superconducting state of the switch member 220.

In an embodiment, a process for making thermal impedance amplifier 200 includes disposing switch layer 218 on substrate 228; disposing thermal conductor 226 on switch layer 218; and disposing resistive layer 210 on thermal conductor 226.

In an embodiment, the material for switch member 220 is disposed on substrate 228 by e.g. sputtering or evaporation. Here, the material for switch member 220 was disposed on substrate 228 by placing substrate 228 in a vacuum chamber in which material from one or more material targets was being sputtered in a low-pressure vacuum (e.g. 3 mTorr of argon). In an embodiment, the materials being sputtered were tungsten (W) and silicon (Si) such that the material disposed on substrate 228 was the superconductor WxSi1-x.

The material for switch member 220 is patterned into the desired shape by means of e.g. reactive ion etching, ion milling, or wet etching. In an embodiment, a pattern is created by either optical lithography or electron beam lithography, and then this pattern is transferred into the material for switch member 220 by reactive ion etching in a low-pressure environment (e.g. 10 mTorr) using the gases SF6 and CF4 for a few minutes, e.g. from 10 seconds to 5 minutes.

According to an embodiment, the first switch electrode 222 and second switch electrode 224 can be disposed at the same time using a lithographic liftoff technique. A pattern was created by either optical lithography or electron beam lithography, and the material for the first switch electrode 222 and second switch electrode 224 is disposed onto the patterned photoresist or patterned electron-beam resist by e.g. evaporation or sputtering. After performing the lithographic process, removing the photoresist or patterned electron-beam resist can remove of undesired electrode material, leaving the first switch electrode 222 and second switch electrode 224. In an embodiment, the electrodes may overlap the switch member in order to make contact and may be made out of a double-layer of evaporated Ti followed by evaporated Au. In another embodiment, the first electrode 222 and second electrode 224 may be patterned by etching instead of liftoff, e.g. in a fashion similar to the switch member 220. in another embodiment, the first switch electrode 222 and second switch electrode 224 may be disposed before the switch member material is disposed.

Thermal conductor 226 may be disposed by e.g. sputtering, PECVD, evaporation, or thermal oxidation. In an embodiment, SiO2 was sputtered in a low-pressure environment (e.g. 3 mTorr argon) for several minutes (e.g. 30 minutes), disposing a thin layer (e.g. 30 nm) over the entire device, covering first switch electrode 222, second switch electrode 224, and switch member 220.

According to an embodiment, the resistance member 212 is disposed using a lithographic liftoff technique. A pattern is created by either optical lithography or electron beam lithography, and the material for the resistance member 212 is disposed onto the patterned photoresist or patterned electron-beam resist by e.g. evaporation or sputtering. After performing the lithographic process, removing the photoresist or patterned electron-beam resist can remove of undesired electrode material, leaving the resistance member 212. In an embodiment, the resistance member may be made out of a thin (e.g. 15 nm) layer of AuPd which was sputtered from an AuPd target (50:50 alloy) in a low-pressure environment (e.g. 15 mTorr argon) for several seconds (e.g. 25 seconds to 3 minutes). In another embodiment, the resistance member 212 may be patterned by etching instead of liftoff, e.g. in a fashion described for the switch member 220.

Figure 29:
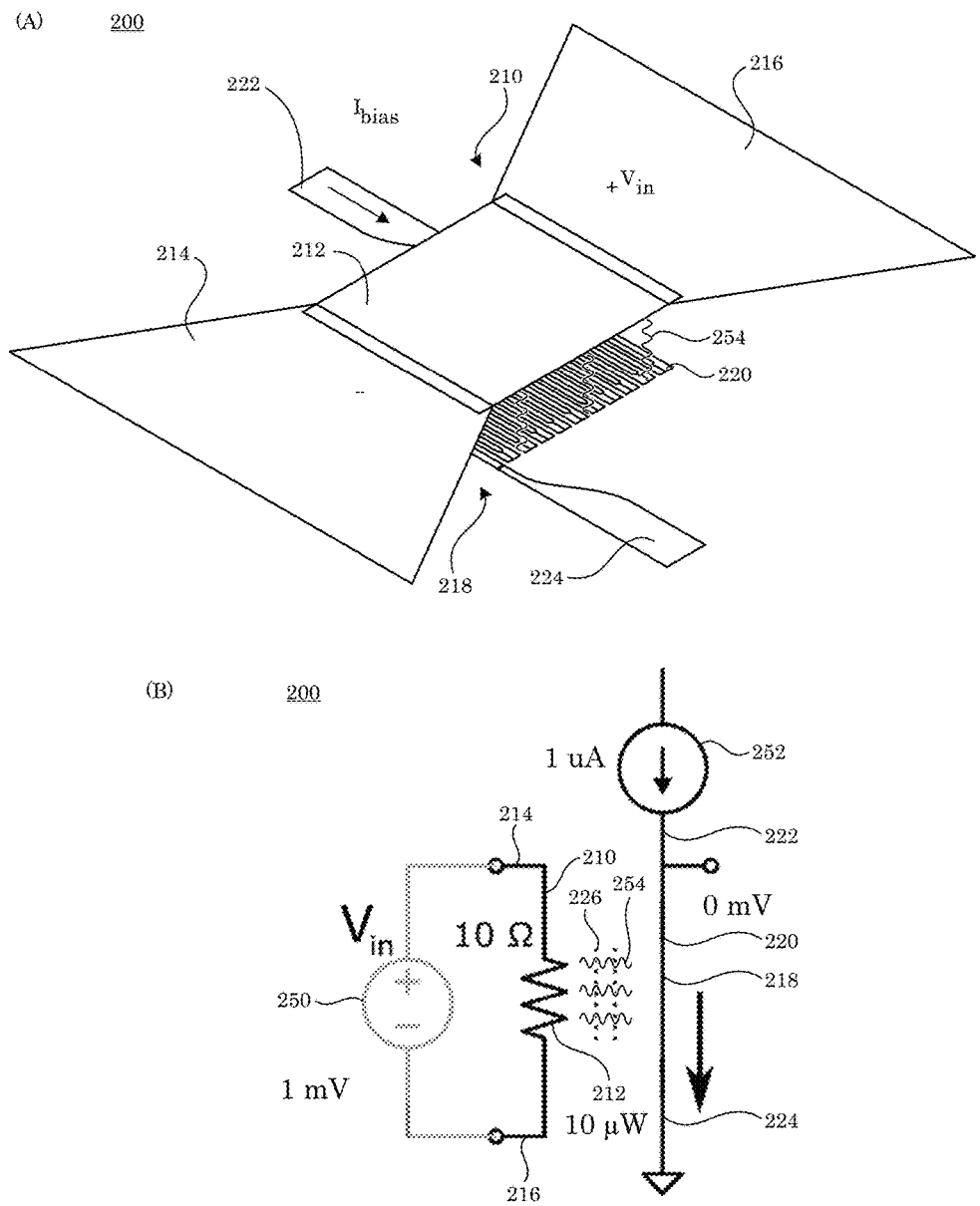
FIG. 29 shows a perspective view of a thermal impedance amplifier in panel A and production of phonons in panel B.
Figure 30:
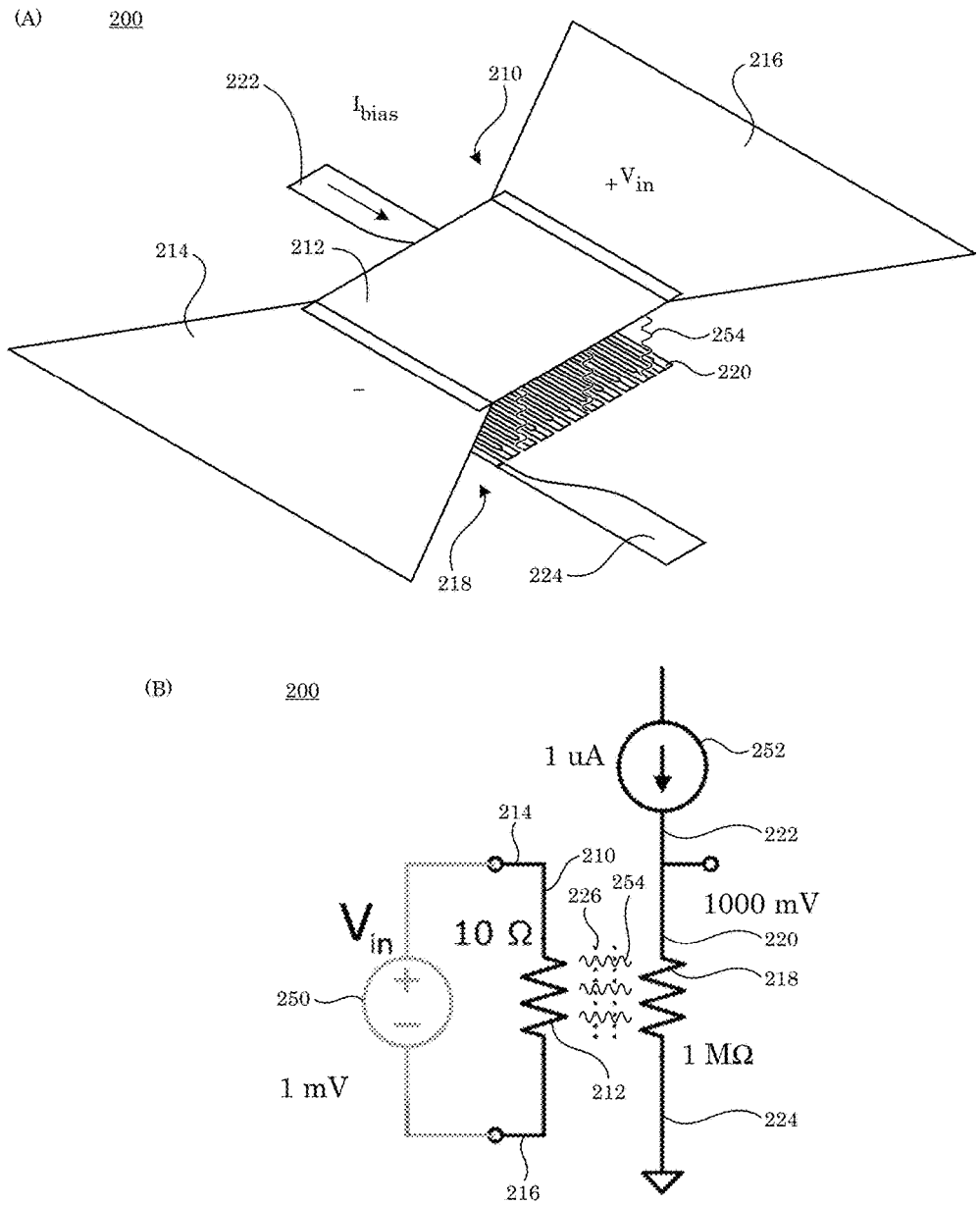
FIG. 30 shows a perspective view of a thermal impedance amplifier in panel A and production of an amplified voltage in panel B.

Thereafter, the first electrode 214 and second electrode 216 can be disposed at the same time using a lithographic liftoff technique. A pattern was created by either optical lithography or electron beam lithography, and the material for the first electrode 214 and second electrode 216 is disposed onto the patterned photoresist or patterned electron-beam resist by e.g. evaporation or sputtering. After performing the lithographic process, removing the photoresist or patterned electron-beam resist can remove of undesired electrode material, leaving the first electrode 214 and second electrode 216. In an embodiment, the electrodes may overlap the resistance member in order to make contact and may be made out of a double-layer of evaporated Ti followed by evaporated Au. In another embodiment, the first electrode 222 and second electrode 224 may be patterned by etching instead of liftoff, e.g. in a fashion described for the switch member 220. in another embodiment, the first electrode 214 and second electrode 216 may be disposed before the resistance member material is disposed Thermal impedance amplifier 200 has numerous beneficial uses, including producing the amplified voltage. In an embodiment, with reference to FIG. 28, FIG. 29, FIG. 30, and FIG. 31, a process for producing the amplified voltage with thermal impedance amplifier 200 includes producing a voltage difference between first electrode 214 and second electrode 216 (see FIG. 28 and FIG. 29); subjecting resistance member 212 to the electric potential formed by the voltage difference (FIG. 29); producing, by resistance member 212, phonons 254 in response to being subjected to the electric potential (FIG. 29); communicating phonons 254 from resistance member 212 to switch member 220 through thermal conductor 226 (FIG. 29); receiving phonons 254 by switch member 220 (FIG. 29); heating switch member 220 in response to receiving phonons 254 from thermal conductor 226 (FIG. 29 and FIG. 30); switching, by switch member 220, from first resistance (FIG. 29) to second resistance (FIG. 30) in response to heating switch member 220; and producing the amplified voltage in response to switching to the second resistance to produce the amplified voltage (FIG. 30).

Figure 28:
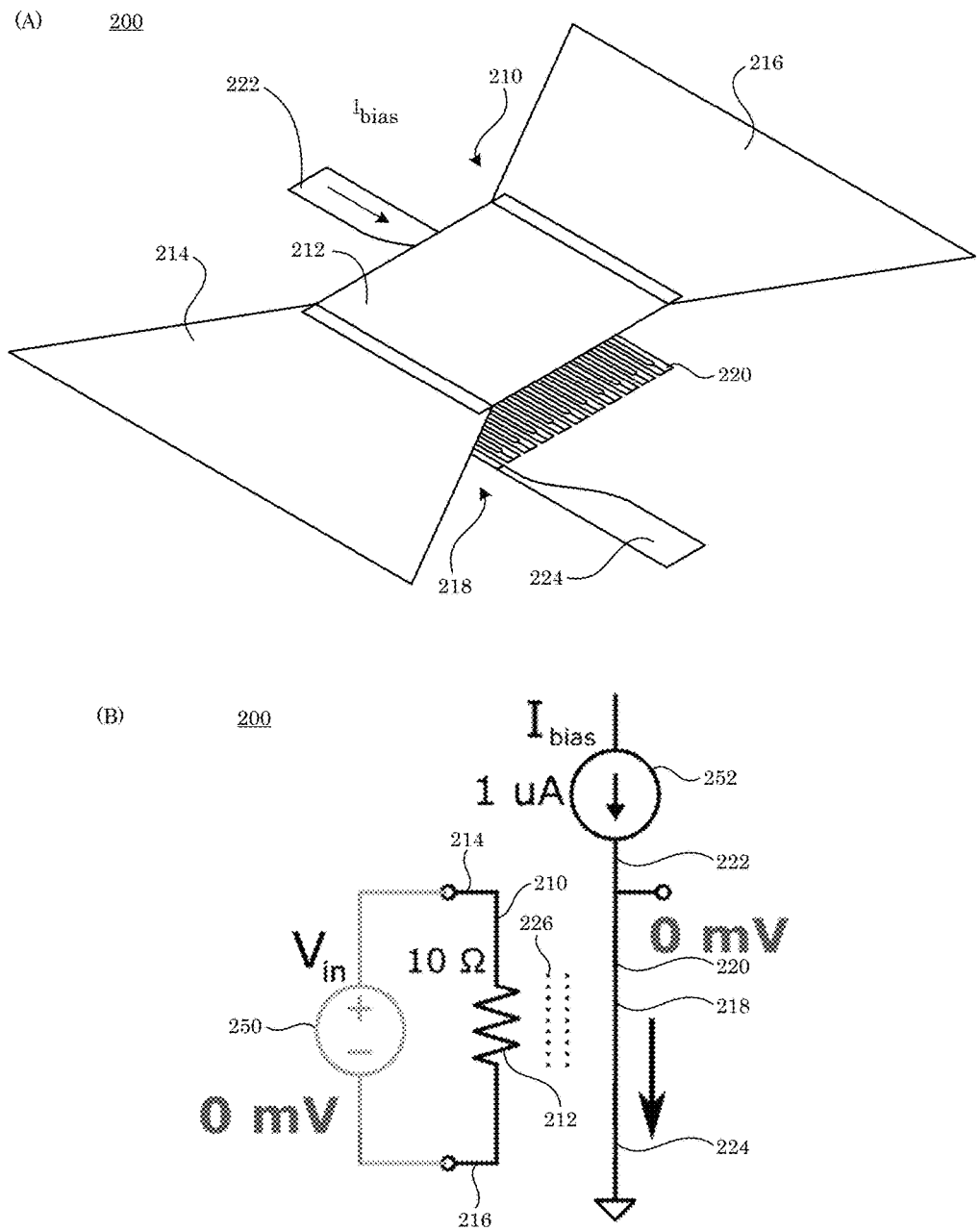
FIG. 28 shows a perspective view of a thermal impedance amplifier in panel A and production of an electrical potential across a resistive layer in panel B.

The process for producing the amplified voltage also can include communicating a bias current through switch member 220 at a first resistance prior to heating switch member 220 (FIG. 28).

In the process for producing the amplified voltage, producing the amplified voltage can include converting the bias current to the amplified voltage according to Ohm's law, wherein bias current passing through the resistance member 212 generates an electrical potential proportional to the product of the resistance value of resistance member 212 times the bias current passing through resistance member 212.

Figure 31:
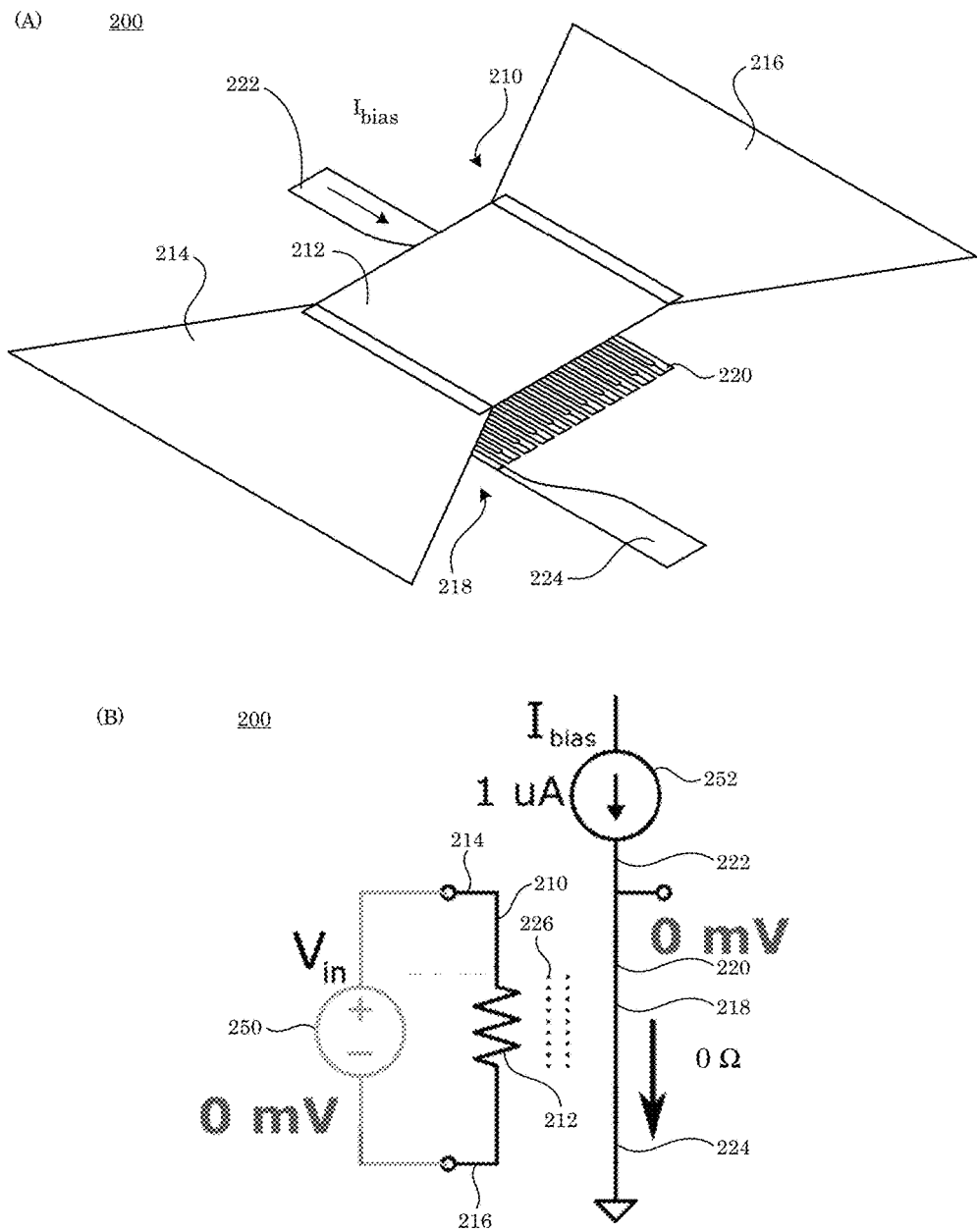
FIG. 31 shows a perspective view of a thermal impedance amplifier in panel A and termination of an electrical potential across a resistive layer in panel B.

The process for producing the amplified voltage also can include decreasing the electric potential (e.g., from FIG. 30 to FIG. 31), cooling resistance member 212 in response to decreasing the electric potential, decreasing an amount of phonons produced by resistance member 212 in response to cooling resistance member 212 (FIG. 31), cooling switch member in response to decreasing the amount of phonons received from resistance member 212; switching from the second resistance to the first resistance in response to cooling switch member (e.g., from FIG. 30 to FIG. 31), and terminating the amplified voltage in response to switching to the first resistance (FIG. 31).

In the process for producing the amplified voltage, subjecting resistance member 212 to the electric potential formed by the voltage difference includes the application of a constant or time-varying electrical power source (such as a voltage source, current source, or microwave RF source) to the first electrode 214 and second electrode 216. This power source can cause electrical current to flow from the first electrode 214, through the resistance member 212, and out the second electrode 216.

In the process for producing the amplified voltage, producing, by resistance member 212, phonons 254 in response to being subjected to the electric potential includes electrical power which may be dissipated in resistance member 212 by e.g. Joule heating can then produce phonons 254. In an embodiment where the resistance member is made from a superconducting material, the Joule heating may not occur until the electrical current passing through the resistance member 212 exceeds the superconducting critical current of the resistance member 212.

In the process for producing the amplified voltage, communicating phonons 254 from resistance member 212 to switch member 220 through thermal conductor 226 includes having the phonons 254 travel from their point of origin in resistance member 212, through the thermal conductor 226, and into the switch member 220. These phonons may be absorbed or received by the switch member 220, or they may raise the temperature of either the switch member 220, the resistance member 212, the thermal conductor 226, or the substrate 228.

In the process for producing the amplified voltage, receiving phonons 254 by switch member 220 includes the absorption of phonons 254 in the switch member 220. This absorption process may directly break the superconducting Cooper pairs in the switch member 220, and it may heat and raise the temperature of the switch member 220.

In the process for producing the amplified voltage, heating switch member 220 in response to receiving phonons 254 from thermal conductor 226 includes the absorption of phonons 254 in the material of switch member 220. The phonons 254 may directly break superconducting Cooper pairs in the switch member 220, or they may first thermalize to lower-energy phonons in the thermal conductor 226, the switch member 220, the substrate 228, or the resistance member 212, after which they may raise the temperature of the switch member 220.

In the process for producing the amplified voltage, switching, by switch member 220, from first resistance to second resistance in response to heating switch member 220 includes the absorption of enough phonons 254 in switch member 220 such that enough Cooper pairs in switch member 220 have been broken and the superconducting state of switch member 220 has been diminished and its critical current value reduced. Without restricting the mechanism of action, this process may heat the switch member 220. The switch member 220 may be heated until it is above its critical temperature and so switch from first resistance to second resistance. Alternatively, the switch member 220 may be heated such that it is still below its critical temperature but has its critical current level reduced to below the threshold of bias current being carried through it, at which point it may switch from first resistance to a value above the first resistance but below or equal to second resistance.

In the process for producing the amplified voltage, producing the amplified voltage in response to switching includes the bias current flowing through the switch member 220 interacting with the resistance value of the switch member 220 according to Ohm's law, producing an electric potential different across the switch member 220 and consequently the first switch electrode 222 and the second switch electrode 224. In the case that the product of the resistance of the switch member 220 and the bias current flowing through switch member 220 is such that the resulting voltage is greater than the input voltage across first electrode 214 and second electrode 216, we call that resulting voltage amplified.

In the process for producing the amplified voltage, cooling resistance member 212 in response to decreasing the electric potential includes reducing or switching off the applied voltage (or current) from power source 250. Once the applied electrical power is reduced, the amount of Joule heating or number of phonons (254) generated per unit time may be diminished.

In the process for producing the amplified voltage, decreasing an amount of phonons produced by resistance member 212 in response to cooling resistance member 212 includes reducing the electrical power dissipated from power source 250. It may also include the carrying away of phonons by e.g. the substrate 228 or the thermal conductor 226.

In the process for producing the amplified voltage, cooling switch member in response to decreasing the amount of phonons received from resistance member 212 includes reducing the temperature of the switch member 220 by the carrying away of phonons from the switch member 220 by e.g. the substrate 228 or the thermal conductor 226.

In the process for producing the amplified voltage, terminating the amplified voltage in response to switching to the first resistance includes the reduction of voltage generated by the bias current passing through the switch member 220.

Thermal impedance amplifier 200 has numerous advantageous and beneficial properties. In an aspect, thermal impedance amplifier 200 can take signals from a low-impedance output and transform them to high-impedance outputs; it can be made in a compact fashion, occupying less than 10 µm×10 µm; it can produce output voltages in excess of 1,0000 mV from input voltages 10 mV or smaller; it can have steady-state (DC) electrical isolation between the input and output; it can have a low crosstalk between input and output even at high frequencies (>1 GHz).

Thermal impedance amplifier 200 advantageously and unexpectedly is takes small input voltage signals from a low-impedance environment (e.g. output signals from a Josephson junction or other superconducting logic element which typically have a bandgap of ~1 mV) and transform them into a large output voltage signal which may be compatible with semiconductor-based circuit elements or photonic elements (e.g. silicon transistors, light-emitting diodes, optical modulators, and the like that can have a bandgap of ~1V). It additionally uses no passive power if the first resistance value of the switch member 220 is equal to zero (e.g. superconducting). Also, it may be configured to operate in a non-hysteric (non-latching) way without additional circuit or elements (whether active or passive), operating such that the output state mirrors the state of the input state (e.g. it does not get stuck on the second resistance state).

The articles and processes herein are illustrated further by the following Examples, which are non-limiting.

EXAMPLES

Example 1. Thermal Switching with a Thermal Impedance Amplifier

Figure 32:
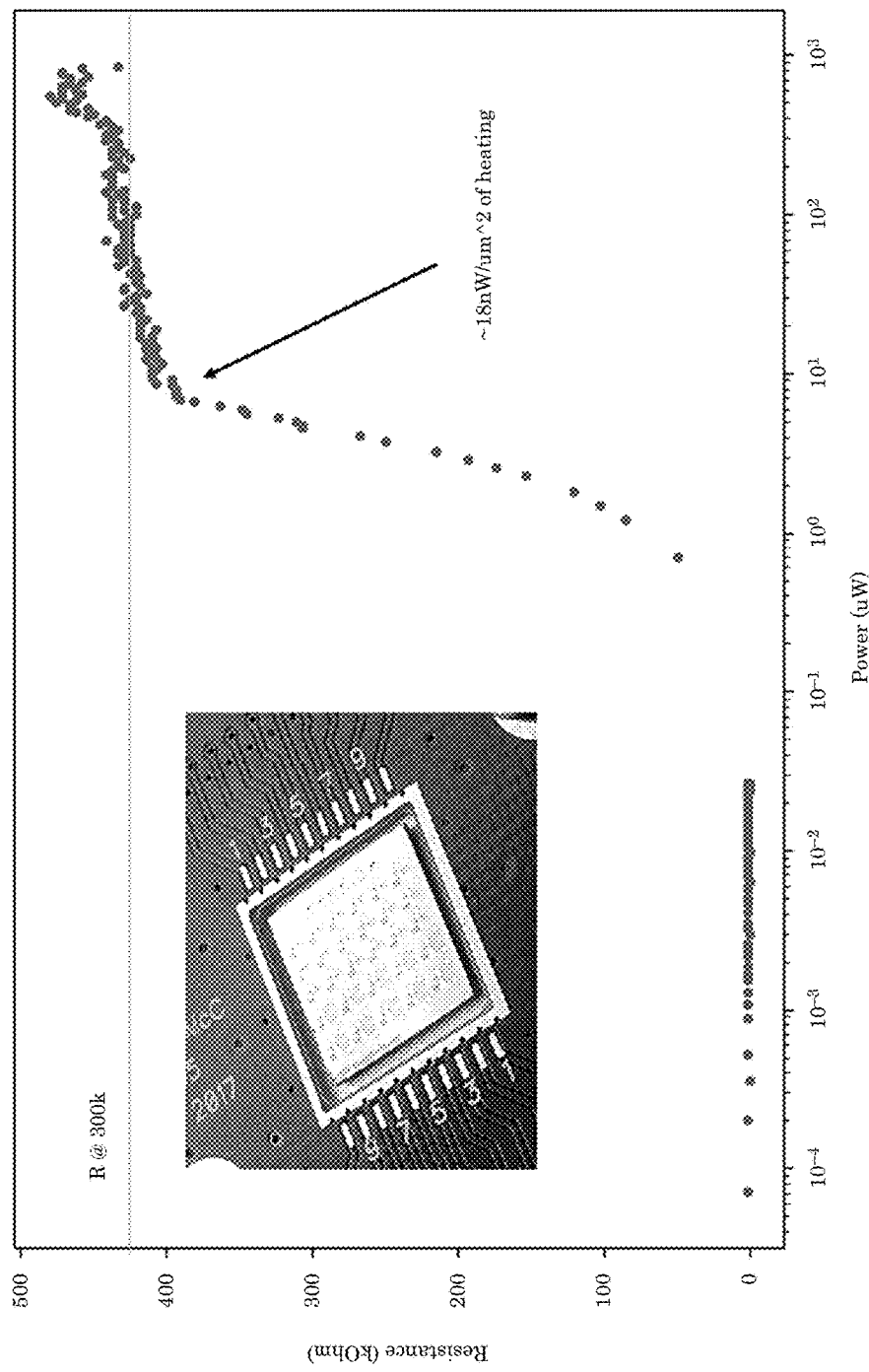
FIG. 32 shows a graph of resistance versus power for a thermal impedance amplifier.

With regard to FIG. 32, the silicon die shown has several thermal impedance amplifiers on it that were created in parallel. It was created by starting with a Si wafer with 300 nm of thermal oxide on it as the substrate. A thin layer of WSi was deposited using co-sputtering (of a W target and a Si target) for 28 s in a sputtering chamber, which had an argon atmosphere at a pressure of 1.2 mTorr. The WSi was measured to have a sheet resistance on the order of 500 Ω/sq. After the WSi was deposited, without removing the substrate 228 from the sputtering chamber a 2-nm-thick Si capping layer was additionally sputtered onto the substrate to protect the underlying WSi layer from e.g. attack by atmospheric oxygen. After depositing the WSi and capping layer onto the substrate, the WSi layer was lithographically patterned using photoresist, and the pattern was transferred into the WSi using a reactive-ion etching step, creating the switch member in a meander pattern. The meander consisted of a wire of width 500 nm wound back and forth over a rectangle of size 20 μm×20 μm with a pitch of 1,000 nm, resulting a normal-state (non-superconducting) resistance of approximately 450 kΩ. Following the etching step, first switch electrode and second switch electrode were created by lithographically patterning their shapes and evaporating 5 nm of Ti followed by 100 nm of Au. Subsequently, the entire wafer was covered with a 30-nm-thick film for the thermal conductor, which was deposited by sputtering of an SiO2 target in a 3 mTorr atmosphere. On top of the SiO2 thermal conductor, to form the resistance member the wafer was again lithographically patterned into the shape of the resistance member (in this case a rectangle of area 16 μm×16 μm with approximate resistance 25Ω), and the resistance member was then formed by sputtering 15 nm of AuPd in a 10 mTorr argon environment. The first electrode and second electrode were then deposited by lithographically patterning their shapes and evaporating 5 nm of Ti followed by 100 nm of Au. The device shown in FIG. 32 was used to gather the data shown in FIG. 32. In the data shown in FIG. 32, each data point was taken by applying a fixed voltage to the resistance member using a voltage source, and a fixed current bias to the resistance member using an approximated current source (e.g. a voltage source in series with a 10 MΩ resistor). For each data point, the input power dissipated (data x-axis) on the resistance member was determined by multiplying the applied voltage and the resulting current, and the output resistance (data y-axis) was determined by measuring the change in voltage (across the first switch electrode and second switch electrode) caused by the application of the input voltage and extracting the resulting series resistance. The data in FIG. 32 shows that this device was able to (1) able to transition from a first resistance of zero, to a variety of second resistances (2) the second resistance was able to be over 400 kΩ, and (3) the power required to reach a second resistance of 400 kΩ (indicating the superconducting state may have been almost completely destroyed in the switch member) with the input power requirement of 10 μW, which translates to approximately 18 nW per square micrometer of resistance member area.

Example 2. Quantum Computing Circuit

Figure 33:
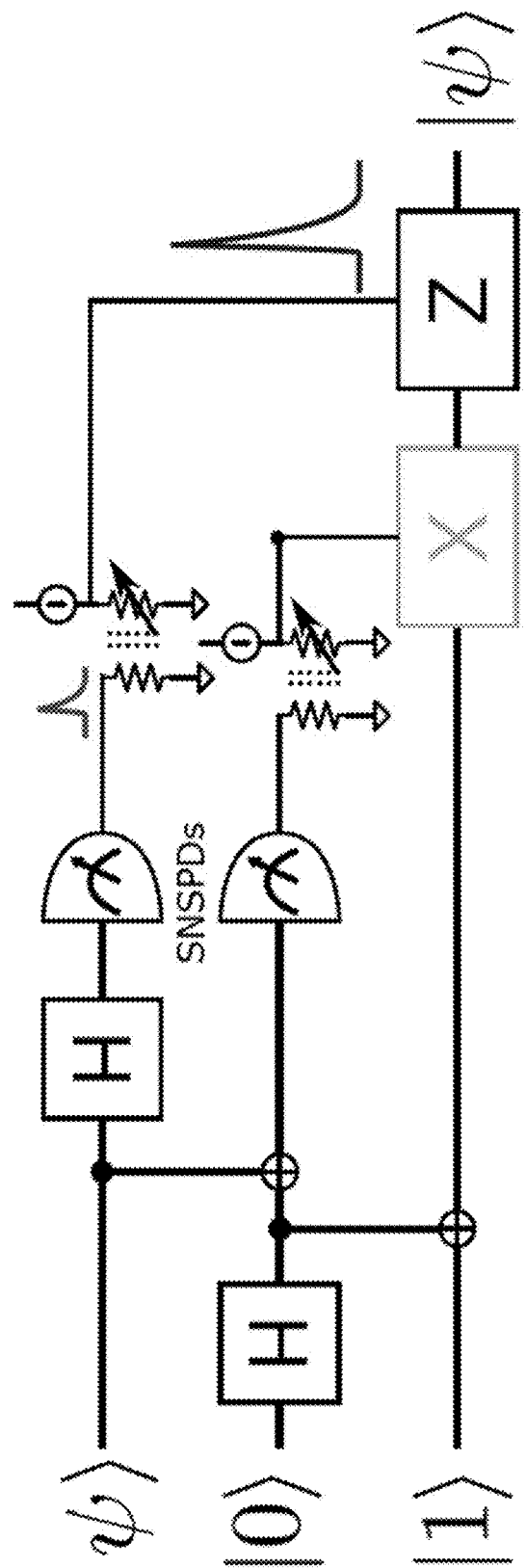
FIG. 33 shows a thermal impedance amplifier in a phtonic computing circuit.

With regard to FIG. 33, displayed is an example of a potential photonic quantum teleportation scheme, in which a quantum state W is input into the left side of the circuit, teleported from the top communications line to the bottom communications line another using two measurements and two gates, and appears at the bottom output. In this circuit, the thermal impedance amplifier is used as an amplification device which translates low-voltage superconducting signals into higher-voltage signals which are compatible with semiconductor electronics. In this example, the quantum states are encoded as photons, and they are measured using superconducting nanowire single-photon nanowire detectors (SNSPDs). The SNSPDs produce a small voltage, on the order of 100 μV, and the thermal impedance amplifier is used to amplify this small voltage into a much larger voltage (on the order of 100-1,000 mV) which is then transmitted to the X and/or Z gates, which in one embodiment may be photonic optical modulators. Since these optical modulators typically require voltages >100 mV to function, the SNSPDs cannot directly drive the modulators, and the thermal impedance amplifier is instead used as a voltage amplification mechanism.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:
1. A thermal impedance amplifier comprising:
a resistive layer comprising:
a resistance member;
a first electrode in electrical communication with the resistance member; and a second electrode in electrical communication with the resistance member such that the resistance member is electrically interposed between the first electrode and the second electrode, the resistance member producing phonons in response to being subjected to an electric potential formed by a voltage difference between the first electrode and the second electrode;

a switch layer opposing the resistive layer and comprising:

a switch member;

a first switch electrode in electrical communication with the switch member; and a second switch electrode in electrical communication with the switch member such that the switch member is electrically interposed between the first switch electrode and the second switch electrode, the switch member:

switching from a first resistance to a second resistance in response to receiving phonons from the resistance member, being superconductive at the first resistance, and producing an amplified voltage in response to being at the second resistance; and a thermal conductor interposed between the resistance member and the switch member and that:

electrically isolates the resistance member from the switch member;

thermally conducts heat from the resistance member to the switch member; and conducts phonons from the resistance member to the switch member to heat the switch member.

2. The thermal impedance amplifier of claim 1, further comprising a power source in electrical communication with the resistive layer and that:

produces the voltage difference between the first electrode and the second electrode.

3. The thermal impedance amplifier of claim 1, further comprising a current source in electrical communication with the switch layer and that:

communicates a bias current to the switch member, wherein the amplified voltage is produced by the switch member from the bias current when the switch member is at the second resistance.

4. The thermal impedance amplifier of claim 1, wherein the switch member is superconducting at the first resistance.

5. The thermal impedance amplifier of claim 1, wherein the switch member comprises a meander pattern.

6. A process for producing an amplified voltage with the thermal impedance amplifier of claim 1, the process comprising:

producing a voltage difference between the first electrode and the second electrode;

subjecting the resistance member to the electric potential formed by the voltage difference;

producing, by the resistance member, phonons in response to being subjected to the electric potential;

communicating the phonons from the resistance member to the switch member through the thermal conductor;

receiving the phonons by the switch member;

heating the switch member in response to receiving the phonons from the thermal conductor;

switching, by the switch member, from the first resistance to the second resistance in response to the heating the switch member; and producing the amplified voltage in response to switching to the second resistance to produce the amplified voltage.

7. The process for producing the amplified voltage of claim 6, further comprising:

communicating a bias current through the switch member at a first resistance prior to heating the switch member.

8. The process for producing the amplified voltage of claim 7, wherein producing the amplified voltage comprises converting the bias current to the amplified voltage according to Ohm's law.

9. The process for producing the amplified voltage of claim 6, further comprising:

decreasing the electric potential;

cooling the resistance member in response to decreasing the electric potential;

decreasing an amount of phonons produced by the resistance member in response to cooling the resistance member;

cooling the switch member in response to decreasing the amount of phonons received from the resistance member;

switching from the second resistance to the first resistance in response to calling the switch member; and terminating the amplified voltage in response to switching to the first resistance.

10. The process for producing the amplified voltage of claim 6, wherein the switch member is superconducting at the first resistance.

11. The process for producing the amplified voltage of claim 6, wherein the switch member comprises a meander pattern.

* * * * *